US012772594B2

(12) United States Patent
Tsou et al.

(10) Patent No.: US 12,772,594 B2
(45) Date of Patent: Oct. 20, 2026

(54) METHODS FOR FORMING A BACK SIDE FILM STACK AND PACKAGE STRUCTURES THEREOF

(71) Applicant: TAIWAN SEMICONDUCTOR MANUFACTURING COMPANY, LTD., Hsinchu (TW)

(72) Inventors: Chuan-Cheng Tsou, Tainan City (TW); Sung-Hsin Yang, Tainan (TW); Jung-Chi Jeng, Hsinchu (TW); Chen-Chieh Chiang, Kaohsiung City (TW); Ru-Shang Hsiao, Hsinchu (TW); Ling-Sung Wang, Tainan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 458 days.

(21) Appl. No.: 18/212,487

(22) Filed: Jun. 21, 2023

(65) Prior Publication Data

US 2024/0429260 A1 Dec. 26, 2024

(51) Int. Cl.

*H10F 39/00* (2025.01)
*H10W 90/00* (2026.01)

(52) U.S. Cl.

CPC ......... *H10F 39/811* (2025.01); *H10F 39/026* (2025.01); *H10F 39/804* (2025.01); *H10W 90/00* (2026.01)

(58) Field of Classification Search

None

See application file for complete search history.

(56) References Cited

U.S. PATENT DOCUMENTS

| | | | | |
|---|---|---|---|---|
| 7,297,609 B2 * | 11/2007 | Kim | .................. H01L 21/76224 257/E21.546 |
| 2009/0197355 A1 * | 8/2009 | Terahara | ........... H01L 21/76224 700/121 |
| 2025/0198049 A1 * | 6/2025 | Kubota | ................... C30B 29/38 |

* cited by examiner

*Primary Examiner* — Sarah K Salerno

(74) *Attorney, Agent, or Firm* — NZ Carr Law Office

(57) ABSTRACT

Embodiments of the present disclosure relate to methods for forming a film stack during fabrication or bonding process. The film stack according to present disclosure may reduce wet dip attacking to semiconductor substrate during bonding, such as bonding between an image sensor substrate and a logic device substrate. The film stack according to the present disclosure may be used to modulate stress and wafer warpage to improve bonding adhesion and device performance during various packaging schemes, such as CoWoS, SoIC, or the like. The film stack according to the present disclosure may be used to improve bonding process and device performance in both wafer-to-wafer bonding and die-to-die bonding.

20 Claims, 40 Drawing Sheets

METHODS FOR FORMING A BACK SIDE FILM STACK AND PACKAGE STRUCTURES THEREOF

BACKGROUND

Semiconductor devices are used in a variety of electronic applications, such as personal computers, cell phones, digital cameras, and other electronic equipment, as examples. Semiconductor devices are typically fabricated by sequentially depositing various insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor substrate. The semiconductor devices on a substrate are grouped to individual dies to achieve designed functions. In some cases, two or more substrates with different devices may be bound together to form a complex substrate where each individual dies includes two or more dies. For example, a substrate with logic devices may be bond to a substrate with image sensors are bound together so that the logic devices are connected to the image sensors and each individual dies may include a logic chip and an image sensor chip. The individual dies are singulated by sawing the integrated circuits along a scribe line. The individual dies are then packaged separately, in multi-chip modules, or in other types of packaging, for example.

The semiconductor industry continues to improve the integration density of various electronic components by continual reductions in minimum feature size, which allow more components to be integrated into a given area. These smaller electronic components require smaller and more advanced packaging systems than packages of the past, in some applications. Additionally, as more and more metal layers adding into the advanced BEOL (back end of line) processing, SOC (system on a chip) substrate warpage becomes higher and higher, which significantly degrades SoIC (system on integrated circuit) chip-on-substrate process window and result in bond low yield.

During bonding and packaging processes, semiconductor devices may be damaged by processing chemistry or stress.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
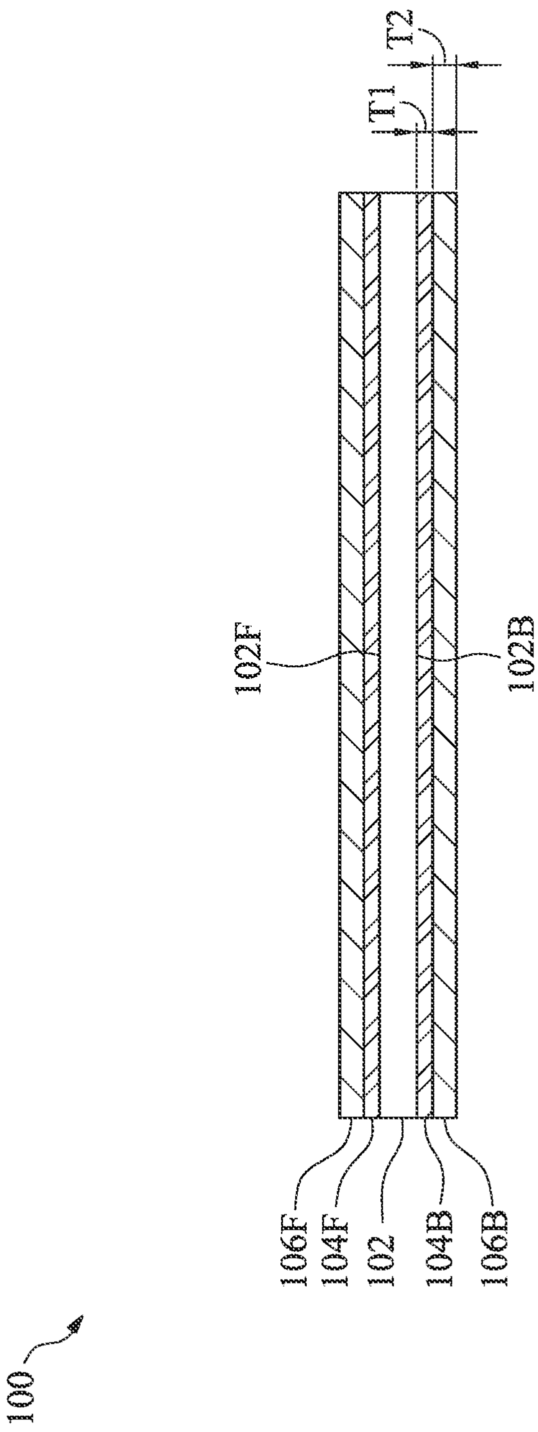
FIGS. 1A-1H are schematic cross-sectional views of a semiconductor substrate being fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure relate to methods for processing and bonding substrates to fabricate integrated circuit chips and the devices fabricated thereof. The substrates may include semiconductor devices formed thereon, for example, on front sides of the substrates, and may be referred to as device substrates. Particularly, embodiments of the present disclosure provide a method for depositing back side dielectric films to protect devices on the substrate and/or to adjust substrate warpage during bonding and packaging. In some embodiments, the back side dielectric films are deposited in a batch processing chamber wherein both dielectric films are formed on both the front side and back side of the substrate. Characteristics of the back side dielectric film, such as stress level, and thickness, may be determined according to the bonding chemistry and packaging scheme.

FIGS. 1A-1H are schematic cross-sectional views of a device substrate 100 being fabricated according to embodiments of the present disclosure. In some embodiments, the device substrate 100 may be a logic device substrate configured to bond with an image sensor substrate to form backside image sensor chips. Alternatively, the device substrate 100 may be any substrates, such as a logic substrate, a system substrate, a memory substrate, or the like, to be stack bonded to another substrate. Embodiments of the present disclosure provide a backside film stack configured to improve backside protection to the devices in the device substrate 100 during bonding process.

Figure 2:
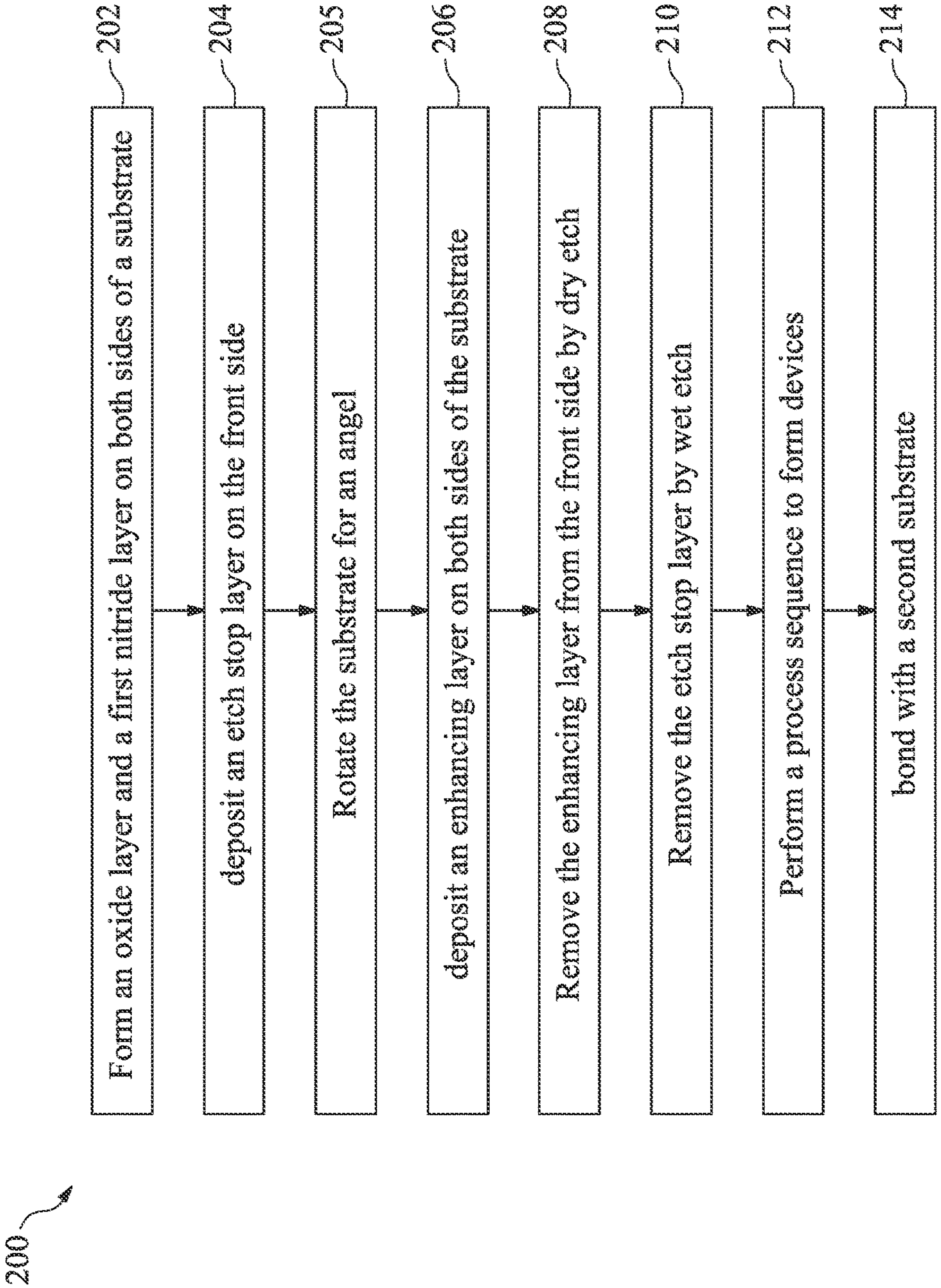
FIG. 2 is a flow chart of a method for fabricating a semiconductor substrate according to embodiments of the present disclosure.

FIG. 2 is a flow chart of a method 200 for fabricating a semiconductor substrate according to embodiments of the present disclosure. In some embodiments, the device substrate 100 may be processed using the method 200. The device substrate 100 is fabricated from a semiconductor wafer.

In operation 202, an oxide film 104 and a transitional layer 106 are sequentially deposited on a front side 102F and a back side 102B of a wafer 102, as shown in FIG. 1A. The wafer 102 is a bare substrate including an elementary semiconductor, such as silicon or germanium in a crystalline, a polycrystalline, or an amorphous structure; a compound semiconductor such as silicon carbide, gallium arsenide, gallium phosphide, indium phosphide, indium arsenide, and/or indium antimonide; an alloy semiconductor, such as e.g., silicon-germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), etc; combinations thereof, or other suitable material. In some embodiments, the wafer 102 includes multi-layer semiconductors, semiconductor-on-insulator (SOI), for example silicon on insulator or germanium on insulator, and/or the like.

As shown in FIG. 1A, a front side oxide film 104F and a back side oxide film 104B (collectively oxide film 104) are formed on the front side 102F and a back side 102B of the wafer 102 respectively. The front side oxide film 104F and the back side oxide film 104B are formed simultaneously and have substantially the same properties, such as composition and thickness. The front side oxide film 104F and the back side oxide film 104B are formed simultaneously in a process chamber where both the front side 102F and the back side 102B of the wafer 102 are exposed to the processing environment. In some embodiments, the oxide film 104 may be formed by flowing an oxidizing precursor to the processing chamber. In some embodiments, one or more cleaning processes may be performed to remove native oxides and/or contaminations from the wafer 102 prior to forming the oxide film 104.

The front side oxide film 104F is sometimes referred to as a pad layer, which may provide isolation to subsequent layers to be formed on the wafer 102. The front side oxide film 104F and the back side oxide film 104B have the same thickness T1. In some embodiments, the thickness T1 is in a range between about 20 A and about 60 A. In some embodiments, when the wafer 102 comprises silicon, the oxide film 104 comprises silicon oxide.

A front side transitional layer 106F and a back side transitional layer 106B (collectively transitional layer 106) are formed on the front side oxide film 104F and the back side oxide film 104B respectively. The front side transitional layer 106F and the back side transitional layer 106F are formed simultaneously and have substantially the same properties, such as composition and thickness. The front side transitional layer 106F and the back side transitional layer 106B are formed simultaneously in a process chamber where both the front side oxide film 104F and the back side oxide film 104B are exposed to the processing environment. In some embodiments, the transitional layer 106 and the oxide film 104 are deposited in the same processing chamber.

In some embodiments, the transitional layer 106 may be a nitride of a semiconductor material, such as a silicon nitride. The transitional layer 106 may be formed by flowing precursors containing a nitrogen source and a semiconductor source.

The front side transitional layer 106F enables adhesion of subsequent layers to be formed on the front side oxide film 104F. For example, when a poly crystalline silicon is subsequently deposited to have semiconductor devices formed therein, the transitional layer 106F allows gradual crystalline transition between the wafer 102, the oxide film 104 and the subsequently formed polycrystalline silicon layer, so that the subsequently formed poly crystalline silicon layer sticks to the wafer 102.

The front side transitional layer 106F and the back side transitional layer 106B have the same thickness T2. In some embodiments, the thickness T2 is in a range between about 200 A and about 600 A.

While the front side oxide film 104F and the front side transitional layer 106F are formed to enable subsequent front end of line processes, the back side oxide film 104B and the back side transitional layer 106B remain on the wafer 102 during the front end of the line processing and may provide protection to the wafer 102 during processing and bonding. However, during certain processing, such as wafer level bonding processes, the back side oxide film 104B and the back side transitional layer 106B that are formed simultaneously with the front side oxide film 104F and the front side transitional layer 106F do not provide sufficient protection to the wafer 102, resulting in damaging to the wafer 102. Embodiments of the present disclosure provide an enhanced back side film stack to prevent damaging the wafer 102 during the bonding process. Operations 204, 206, 208, and 210 can be performed to form an enhanced back side film stack.

Figure 1B:
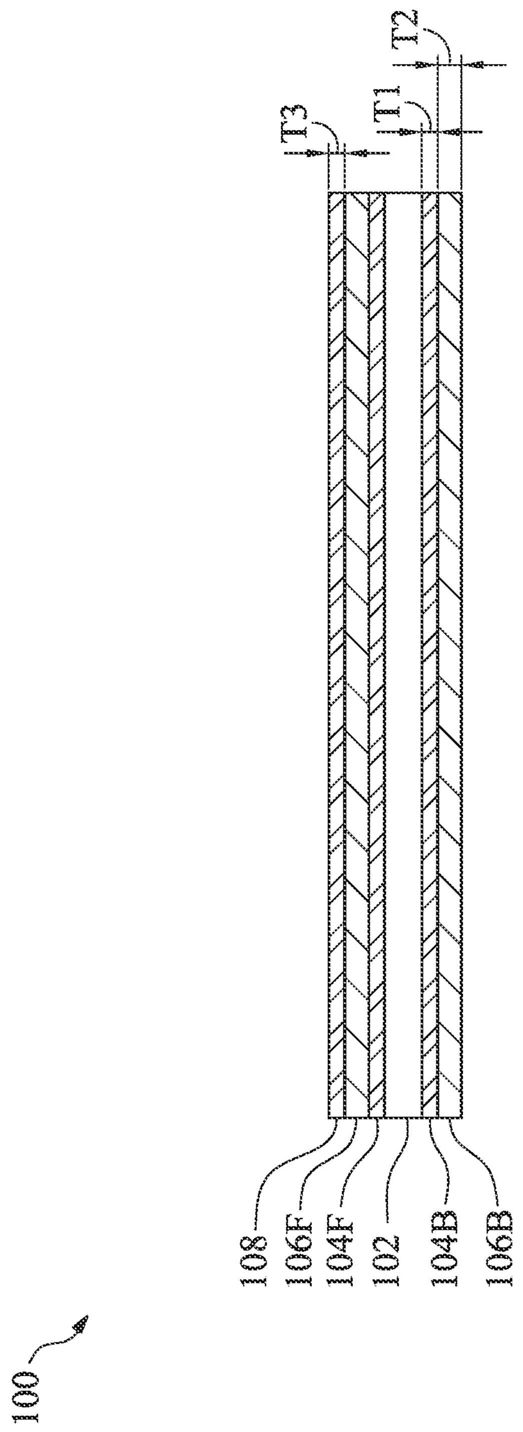

In operation 204, an etch stop layer 108 is deposited on the front side transitional layer 106F, as shown in FIG. 1B. The etch stop layer 108 is configured to function as an etch stop during dry etch of a subsequent dielectric film on the etch stop layer 108 and may be selective removed from the front side transitional layer 106F. The etch stop layer 108 may have a thickness T3. In some embodiments, the thickness T3 is in a range between about 20 A and about 200 A.

In some embodiments, the etch stop layer 108 is an oxide film, such as silicon oxide. The etch stop layer 108 may be formed in a process chamber where the back side of the device substrates 100 is not exposed to the processing environment. In some embodiment, the etch stop layer 108 may be formed by any suitable process, such as atomic layer deposition (ALD), plasma enhanced atomic layer deposition (PEALD), chemical vapor deposition (CVD), plasma enhanced chemical vapor deposition (PECVD), or a low-pressure chemical vapor deposition (LPCVD).

Figure 1C:
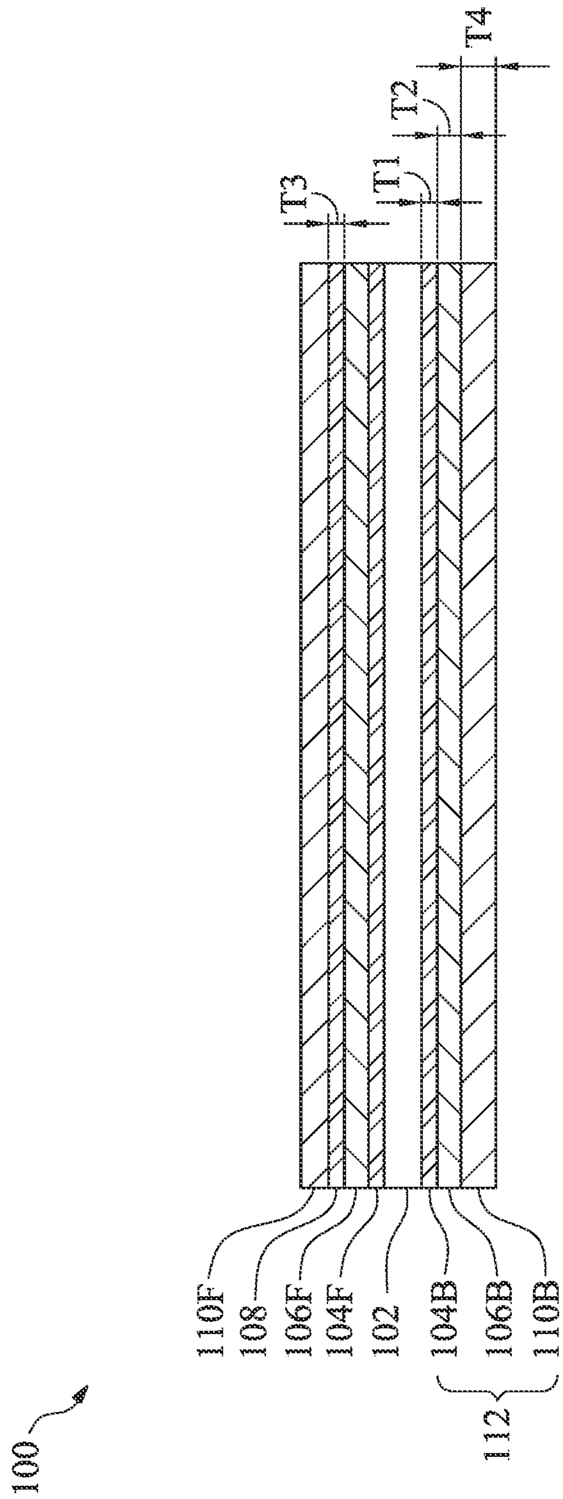

In operation 206, an enhancing layer 110 is formed both a front side and a back side of the device substrates 100, as shown in FIG. 1C. A front side enhancing layer 110F and a back side enhancing layer 110B (collectively enhancing layer 110) are formed on the etch stop layer 108 and the back side transitional layer 106B respectively. The front side enhancing layer 110F and the back side enhancing layer 110B are formed simultaneously and have substantially the same properties, such as composition and thickness. The front side enhancing layer 110F and the back side enhancing layer 110B are formed simultaneously in a process chamber where both the etch stop layer 108 and the back side transitional layer 106B are exposed to the processing environment.

The enhancing layer 110 may be any film suitable to deposit on the back side transitional layer 106B such that the back side oxide film 104B, the back side transitional layer 106B, and the back side enhancing layer 110B form a back side film stack 112. The back side film stack 112 may remain on the wafer 102 during most processing steps to provide protection. In some embodiments, the back side film stack 112 may also function as a stress modulation or warpage adjustment film to achieve a certain warpage in the device substrate 100.

The back side enhancing layer 110B has a thickness T4. In some embodiments, the thickness T4 is in a range between about 200 A and about 1600 A. A thickness less than 200 A may not provide sufficient protection or stress modulation/warpage adjustment. A thickness less than 2000 A may create too much stress and causing the back side film stack 112 to peel off from the wafer 102.

In some embodiments, the back side enhancing layer 110B may include a suitable dielectric film, such as a semiconductor nitride or a semiconductor oxide. In some embodiments, the back side enhancing layer 110B may include silicon nitride ($Si_3N_4$ or SiN), silicon oxynitride (SiON), Si-rich silicon nitride, a N-rich silicon nitride, tetraethylorthosilicate (TEOS), silicon oxide, or the like. In some embodiments, the back side enhancing layer 110B may be a nitride of a semiconductor material, such as a silicon nitride. The back side enhancing layer 110 may be formed by flowing precursors containing a nitrogen source and a semiconductor source.

In some embodiments, the back side enhancing layer 110B and the back side transitional layer 106B may include the same material, such as a silicon nitride. In some embodiments, composition of the back side enhancing layer 110B may be selected according to the desired stress level.

In some embodiments, the method 200 includes an optional operation 205 to be performed prior to the operation 206. In operation 205, the device substrate 100 or the wafer 102 after operation 204 is rotated for an angle relative to substrate supports so that the substrate support does not block both the enhancing layer 110 and the transitional layer 106, particularly when the enhancing layer 110 and the transitional layer 106 are deposited in the same or similar processing chamber. For example, the enhancing layer 110 and the transitional layer 106 may be deposited in the same or similar batch processing chambers with substrate support towers in contact with a portion of the back side of the substrates being processed, as shown in the example of FIG. 8A.

Figure 8A:
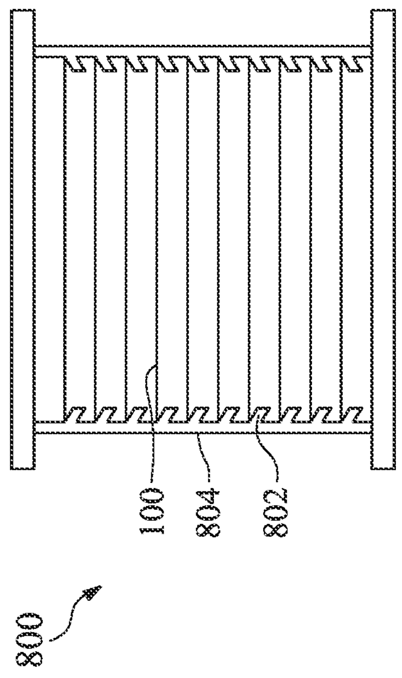
FIG. 8A is a schematic side view of a substrate support tower for a batch processing chamber.
Figure 8C:
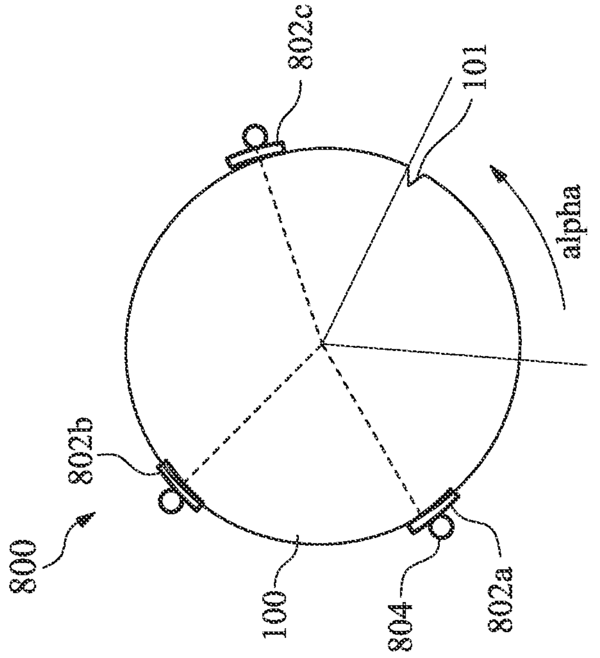
FIGS. 8B and 8C are schematic top view of the substrate support tower supporting substrates disposed at different positions.
Figure 8B:
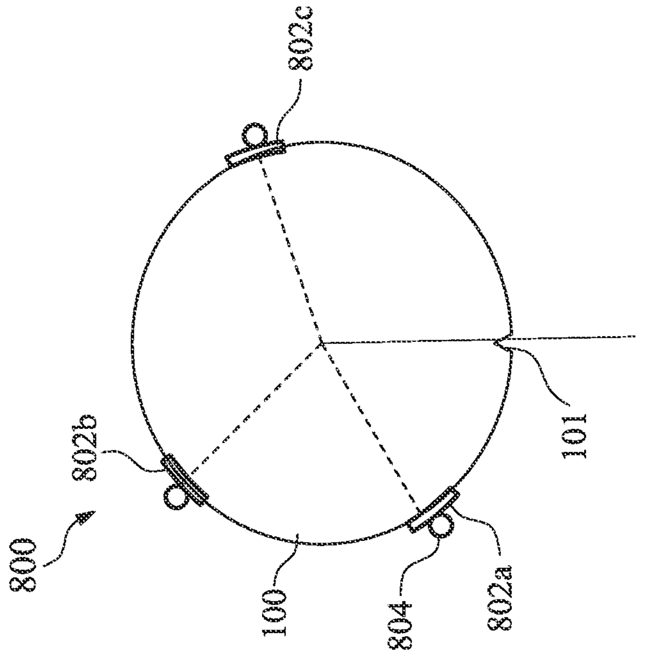

FIG. 8A is a schematic side view of a substrate support tower 800 used in a batch processing chamber wherein a plurality of device substrates 100 may be processed. FIG. 8B is a schematic top view of the substrate support tower 800 having device substrates 100 disposed thereon. As shown in FIGS. 8A-8B, the substrate support tower 800 includes support pins 802 configured to contact and support a plurality of substrates during processing. The support pins 802 may be evenly distributed along support poles 804. In some embodiments, the substrate support tower 800 include three support poles 804 so that each substrate is contacted by three support pins 802*a*, 802*b*, 802*c*. As shown in FIG. 8A, the support pins 802 are in contact with a back side of device substrate 100. Therefore, areas on the back side of the device substrates 100 in contact with the support pins 802 are blocked by the support pins 802 without film deposition.

In FIG. 8B, the device substrate 100 is disposed related to the support pins 802 at a first position. The relative position between the substrate 100 and the support pins 802 may be controlled by a marker or notch 101 formed on an edge of the device substrate 100. FIG. 8C is a schematic top view of the substrate support tower 800 having device substrates 100 disposed thereon at a second position. The device substrates 100 is rotated at an angle alpha from the first position to the second position. In some embodiments, the enhancing layer 110 and the transitional layer 106 are deposited in the same or similar batch processing chamber with the device substrates 100 positioned at different positions. For example, the transitional layer 106 is deposited while the device substrates 100 is disposed on the support tower 800 at the first position, and the device substrates 100 is rotated an angle alpha and disposed on the support tower 800 at the second position to deposit the enhancing layer 110. In some embodiments, the angel alpha is in a range between about 20 degrees and 60 degrees.

Figure 1D:
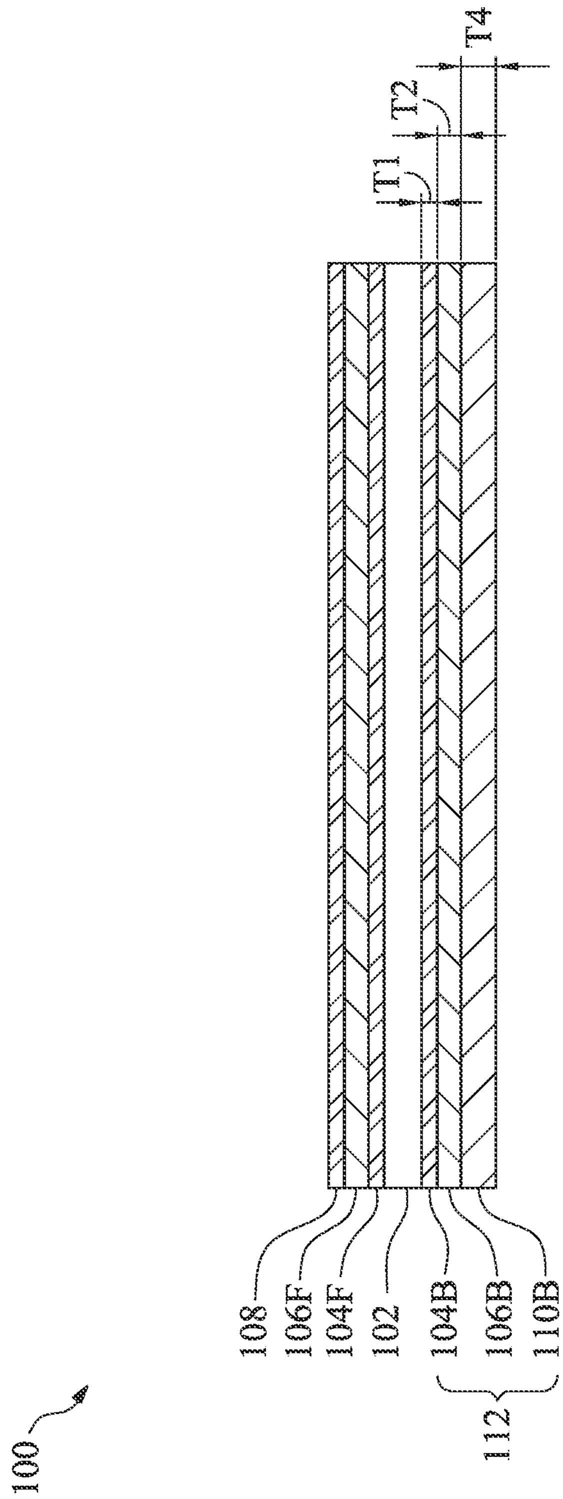

In operation 208, the front side enhancing layer 110F is removed while the back side enhancing layer 110B remains intact, as shown in FIG. 1D. In some embodiments, the front side enhancing layer 110F may be removed with a dry etch process. In some embodiments, the front side enhancing layer 110F may be removed using a dry etch chemistry with a plasma source and an etchant gas. The plasma source may be an inductively coupled plasma (ICR) etch, a transformer coupled plasma (TCP) etch, an electron cyclotron resonance (ECR) etch, a reactive ion etch (RIE), or the like. In some embodiments, the etchant gas may include tetrafluoromethane ($CF_4$), difluoromethylene ($CH_2F_2$), hexafluoroethane ($C_2F_6$), and argon, with optional addition of oxygen and/or nitrogen to control etch rate and etch selectivity. In some embodiments, the etchant gas has a high etch selectivity of the front side enhancing layer 110F over the etch stop layer 108. The etch stop layer 108 allows the front side enhancing layer 110F to be removed without damaging the front side transitional layer 106F.

Figure 1E:
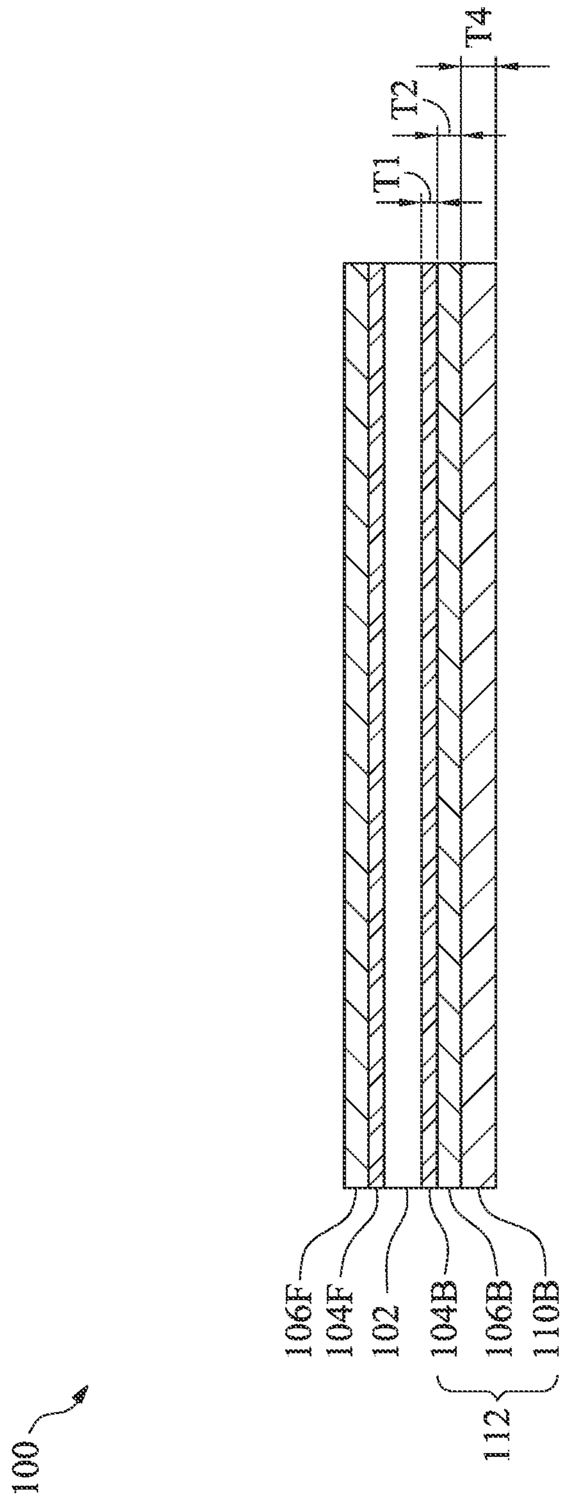

In operation 210, the etch stop layer 108 is removed to expose the front side transitional layer 106F for subsequent processing as shown in FIG. 1E. In some embodiments, the etch stop layer 108 may be removed by a wet etch process, such as a dilute HF dip process. Alternatively, a plasma etching process may be carried out with a conventional dry etching chemistry such as HBr, and $Cl_2$ to minimize damage to the front side transitional layer 106F.

Figure 1F:
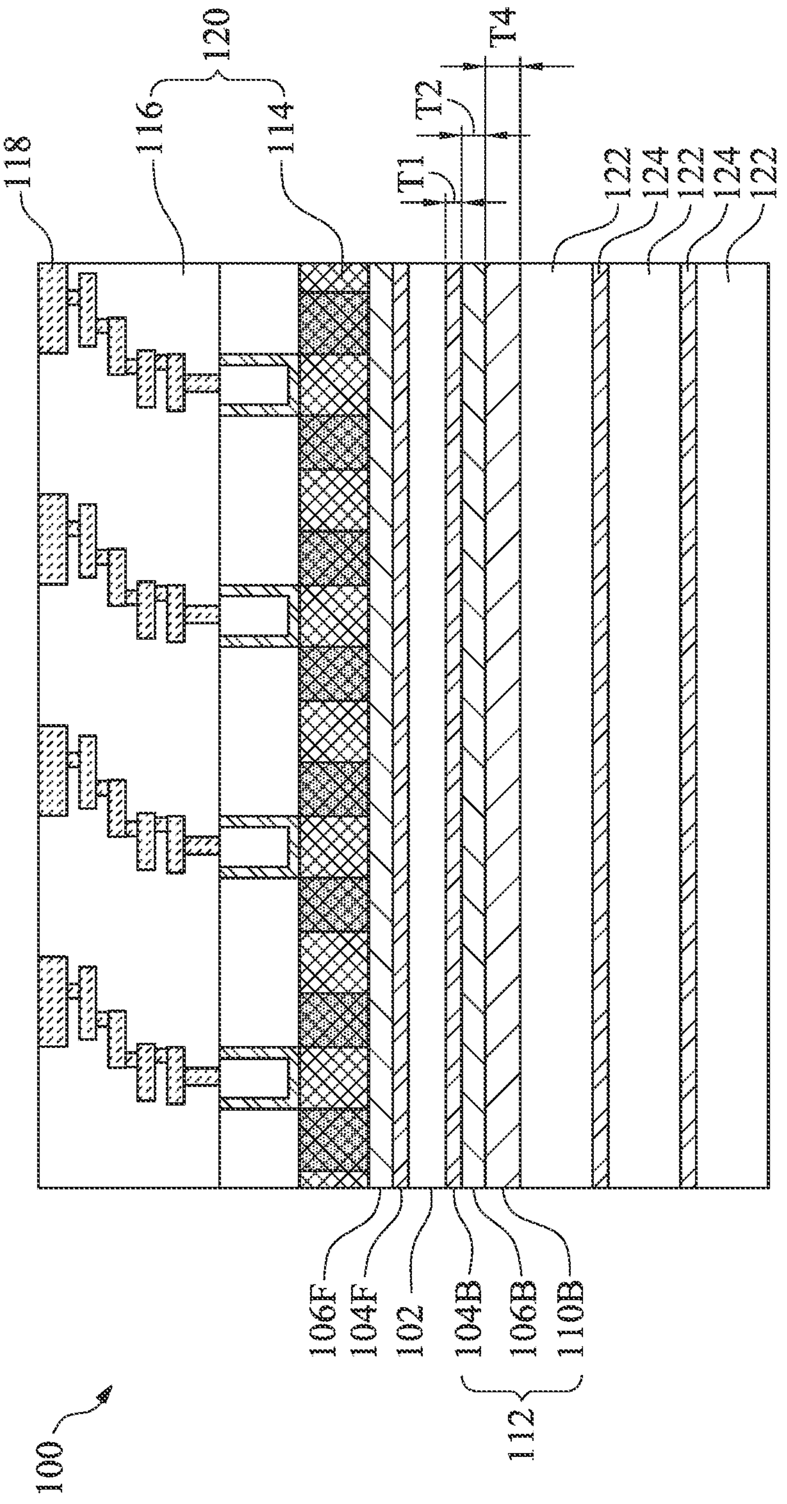

In operation 212, a processing sequence is performed to fabricate a circuitry structure 120 on the front side transitional layer 106F, as shown in FIG. 1F. The circuitry structure 120 may include a semiconductor component layer 114 and an interconnect structure sequentially formed on the wafer 102. The circuitry structure 120 can be a logic circuit, a memory circuit, a sensor circuit, or the like. In some embodiments, the circuitry structure 120 may be a control circuit for a sensor circuit.

The semiconductor component layer 114 may include one or more active components, e.g., transistors or the like, and one or more passive component, e.g., resistors, capacitors, inductors, or the like, or a combination thereof. The semiconductor component layer 114 may be formed using front-end of line (FEOL) fabrication techniques. In some embodiments, the FEOL includes at least several processes selected from an isolation process, a channel formation process, a gate oxidation/gate formation process, a doping process, a spacer formation process, and a source/drain formation process. The semiconductor component layer 114 may include contact structures formed using middle-end of line (MEOL) fabrication techniques. The MEOL includes contact metal formation process. The interconnect structure 116 may be formed using back-end of line (BEOL) fabrication techniques. The BEOL includes the formation and the patterning of dielectric layers and conductive metal layers. In some embodiment, the BEOL and the MEOL may be combined.

The interconnect structure 116 includes a plurality of interconnect layers embedded in a dielectric layer structure. The dielectric layer structure may include one or more of an oxide, an ultra-low-k dielectric material, a low-k dielectric material, and/or the like, and the interconnect layers may include conductive material, such as copper, aluminum, tungsten, a combination thereof, and/or the like. The interconnect layers may include a plurality of metal patterns, e.g., pads and lines. and metal vias alternatingly stacked in the dielectric layer structure. The interconnect structure 116 includes contact structures that connect the semiconductor components from in the semiconductor component layer 114. In some embodiments, the interconnect structure 116 includes contact pads 118 on a top surface of the interconnect structure 116. The contact pads 118 are configured to be bonded to contact pads on another semiconductor substrate. The contact pads 118 may be formed from any suitable material. In some embodiments, the contact pads 118 are formed from a metal, such as copper.

During the FEOL fabrication, one or more polycrystalline silicon layers 122 may be formed on the back side of the wafer 102, over the back side film stack 112, as shown in FIG. 1F. In some embodiments, the polycrystalline silicon layers 122 may be separated by a dielectric layer 124. The one or more polycrystalline silicon layers 122 and the dielectric layers 124 are by products of the FEOL process in which polycrystalline silicon layers are growing on the front side to form the semiconductor component layer 114. The polycrystalline silicon layers 122 and the dielectric layers 124 are subsequently removed after the device substrate 100 is bonded or packaged.

Figure 1G:
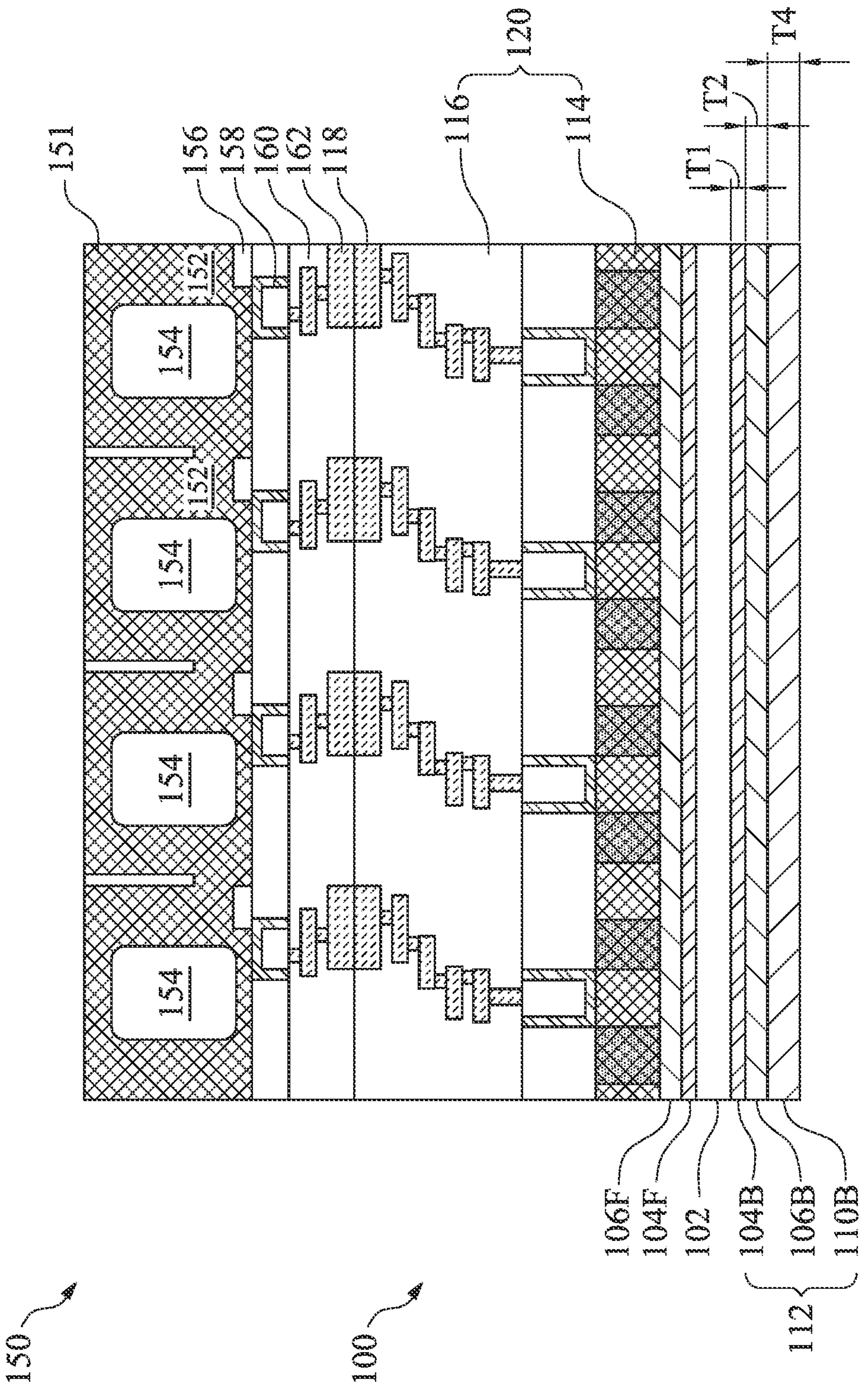

In operation 214, the device substrate 100 is bonded to a second semiconductor substrate 150, as shown in FIG. 1G. In some embodiments, the second semiconductor substrate 150 is a sensor die substrate having a sensor region 152 defined in a wafer 151. The sensor region 152 may include one or more photosensitive regions 154 corresponding to individual pixels. The photosensitive region 154 forms a photodiode with a doped region in the sensor region 152. The sensor region 152 further includes a drain region 156 for each individual pixel. A transfer gate 158 may span the drain region 156 and photodiode to form a pixel. The transfer gate 158 may comprise an insulating layer and a gate contact.

The semiconductor substrate 150 further includes an interconnect structure 160 formed over the sensor region 152. The interconnect structure 160 may comprise one or more dielectric layers with conductive lines and vias disposed in a dielectric material in connection with the pixels in the sensor region 152. Contact pads 162 may be formed in the uppermost dielectric layer with a top surface exposed. The contact pads 162 are in connection with the pixels in the sensor region 152 through the conductive lines and vias in the interconnect structure 160. The contact pads 162 may be formed from any suitable material. In some embodiments, the contact pads 162 are formed from a metal, such as copper.

The contact pads 162 in the semiconductor substrate 150 and the contact pads 118 in the device substrate 100 are designed to align with each other and form electrical connections when the semiconductor substrate 150 and the device substrate 100 are bonded to each other.

Various bonding techniques may be employed to achieve bonding between the device substrate 100 and the semiconductor substrate 150. Suitable bonding techniques may include direct bonding, hybrid bonding and the like.

FIG. 1G illustrates metal-to-metal bonding where the contact pads 118 and the corresponding contact pads 162 are compressed under heat to fuse the metals and form a bond. In some embodiments, a thermo-compression process may be performed on the device substrates 100, 150. The thermo-compression process leads to metal inter-diffusion. In some embodiments, the contact pads 118, 162 are copper and the copper atoms of the contact surfaces may acquire enough energy to diffuse between the contact pads 118, 162. As a result, a homogeneous copper interface may be formed between two contact pads 118, 162. Such a homogeneous copper interface helps the contact pads 118, 162 form a uniform bonded feature. In addition, the uniform bonded feature also provides a mechanical bond to hold the device substrates 100, 150 together.

In some embodiment, the top surfaces of the contact pads 118, 162 may be about level with the top surfaces of the corresponding semiconductor devices 100, 150. In other embodiments, the top surfaces of the contact pads 118, 162 may be raised above the respective top surface of the substrate to ensure good metal-to-metal contact between the contact pads 118, 162. As a result, the contact pads 118, 162 may be fused by metal-to-metal contact, and the device substrates 100, 150 are spaced apart. In some embodiments, an underfilling or adhesive may be deposited where such spacing occurs.

Figure 1H:
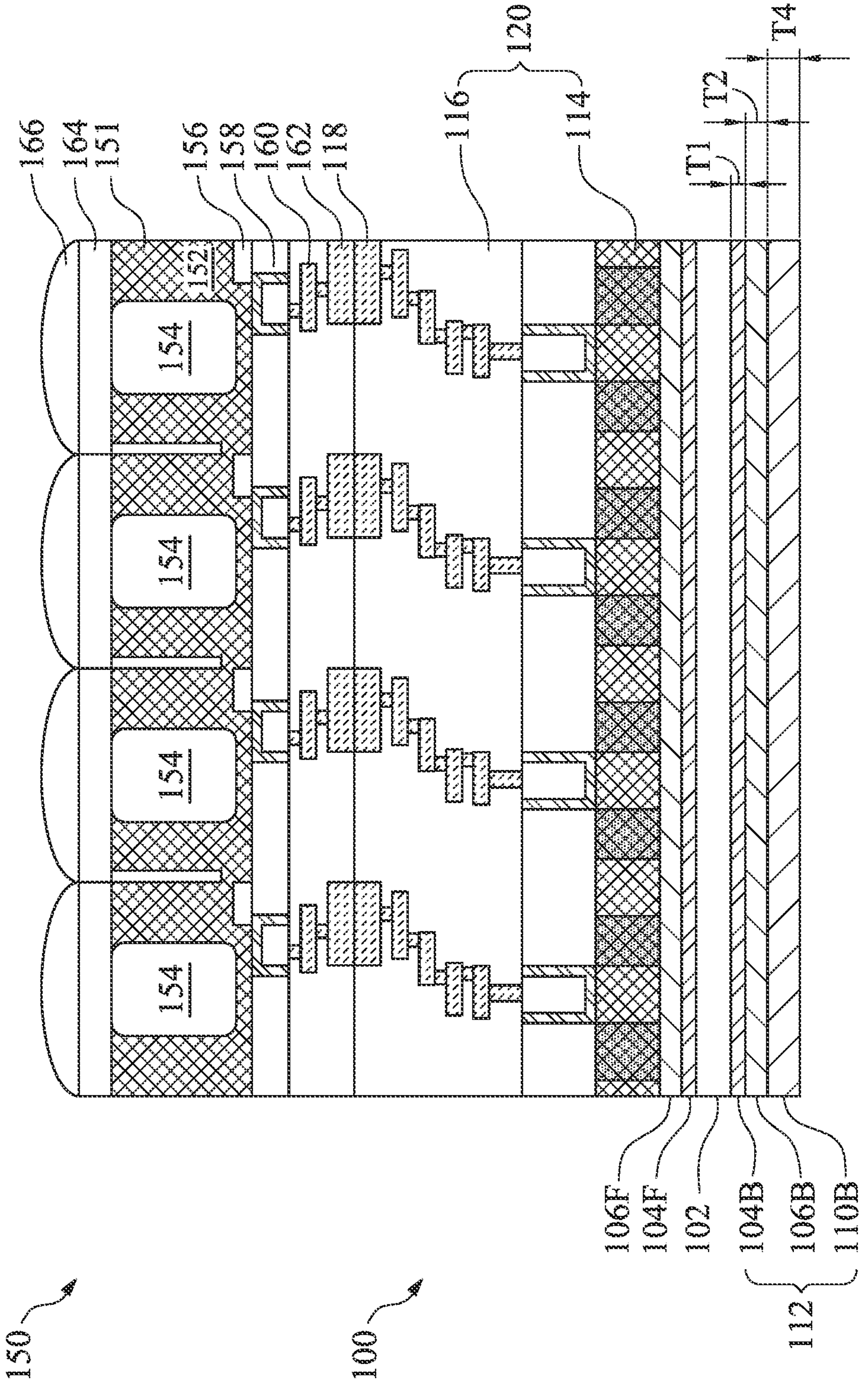

After the device substrates 100, 150 are bonded, color filters 164 and micro-lenses 166 may be formed on the semiconductor substrate 150, as shown in FIG. 1H. The wafer 151 is thinned at the backside until the wafer 151 reaches a predetermined thickness. Such a thinned wafer 151 allows light to pass through the wafer 151 and hit the photosensitive regions 154 of the photodiodes embedded in the wafer 151 with less absorption by the wafer 151. The thinning process may be implemented by using suitable techniques such as grinding, polishing and/or chemical etching. In some embodiments, the thinning process may be implemented by using a chemical mechanical polishing (CMP) process. In a CMP process, a combination of etching materials and abrading materials are put into contact with the backside of the wafer 151 and a grinding pad is used to grind away the backside of the wafer 151 until a desired thickness is achieved. During the thinning process, the back side film stack 112 protects the circuitry structure 120 in the device substrate 100.

After thinning of the wafer 151, the color filters 164 may be applied to the backside of the wafer 151. The color filters 164 may be used to allow specific wavelengths of light to pass while reflecting other wavelengths, thereby allowing the image sensor to determine the color of the light being received by the photosensitive region 154. The color filters 164 may vary, such as a red, green, and blue filter. Other combinations, such as cyan, yellow, and magenta, or white, transparent or almost transparent may also be used. The number of different colors of the color filters 164 may also vary.

In some embodiments, the color filters 164 may comprise a pigmented or dyed material, such as an acrylic. For example, polymethyl-methacrylate (PMMA) or polyglycidylmethacrylate (PGMS) are suitable materials with which a pigment or dye may be added to form the color filters 164. Other materials, however, may be used. The color filters 164 may be formed by another suitable method known in the art.

The micro-lenses 166 may be formed over the color filters 164. The micro-lenses 166 may be formed of any material that may be patterned and formed into lenses, such as a high transmittance, acrylic polymer. In some embodiments, the micro-lenses 166 is about 0.1 μm to about 2.5 μm thick. The micro-lenses 166 may be formed using a material in a liquid state and spin-on techniques known in the art. In some embodiments, the spin-on layer is cut to form individual lenses and then reflowed to permit the cut portions of the spun-on layer to form curved surfaces of individual lenses. Other methods, such as deposition techniques like chemical vapor deposition (CVD), physical vapor deposition (PVD), or the like, may also be used.

During the bonding and subsequent processes, such as wet etching and cleaning process, the extra layers in the back side film stack 112 protects the circuitry structure 120 in the device substrate 100 from being damaged by the processing chemistry.

FIGS. 3A-3G are schematic cross-sectional views of a device substrate 300 being fabricated according to embodiments of the present disclosure. The device substrate 300 includes a back side film stack that is fabricated differently from the back side film stack 112 of the semiconductor substrate 100. FIG. 4 is a flow chart of a method 400 for fabricating a semiconductor substrate according to embodiments of the present disclosure. The device substrate 300 may be fabricated according to the method 400.

Similar to the device substrate 100, the device substrate 300 also includes a back side film stack to provide additional protection during bonding process. However, the device substrate 300 includes a back side film stack 312 is formed differently than the back side film stack 112 of the device substrate 100. Particularly, the back side film stack 312 is formed by performing operations 404, 406, 408, 410 in the method 400. In some embodiments, the back side film stack 312 may be formed by repeating the operations 404, 406, 408, 410 two or more times to achieve desirable thickness.

The method 400 includes the operation 202, as described above and shown in FIG. 3A. The oxide film 104 and transitional layer 106 are sequentially deposited on the front side 102F and the back side 102B of the wafer 102.

Figure 3A:
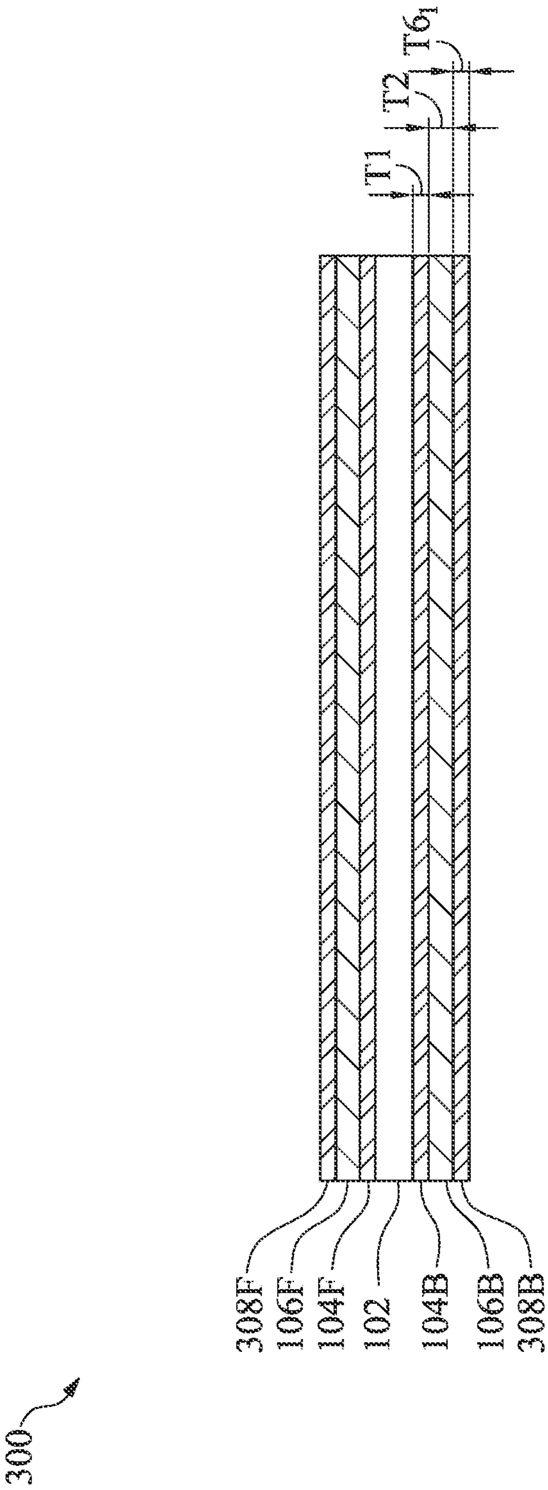
FIGS. 3A-3H are schematic cross-sectional views of a semiconductor substrate being fabricated according to embodiments of the present disclosure.
Figure 4:
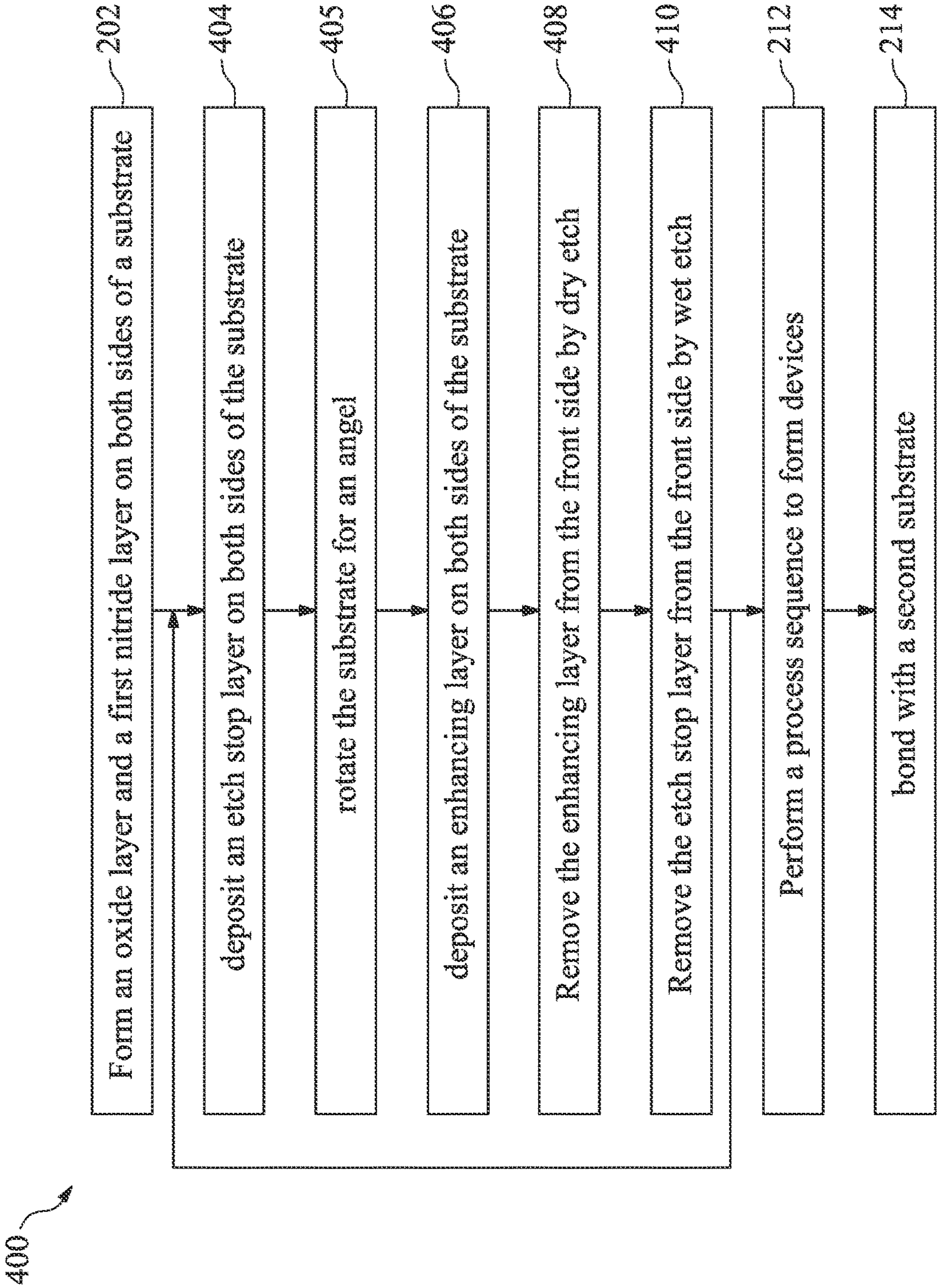
FIG. 4 is a flow chart of a method for fabricating a semiconductor substrate according to embodiments of the present disclosure.

In operation 404, an etch stop layer 308 is deposited on both sides of transitional layer 106F, as shown in FIG. 3A. A front side etch stop layer 308B and a back side etch stop layer 308B (collectively etch stop layer 308) are formed on the front side transitional layer 106F and the back side transitional layer 106B respectively. The front side etch stop layer 308F and the back side etch stop layer 308F are formed simultaneously and have substantially the same properties, such as composition and thickness. The etch stop layer 308 is configured to function as an etch stop during dry etch of a subsequent dielectric film on the etch stop layer 308 and may be selective removed from the front side transitional layer 106F. The etch stop layer 308 may have a thickness T61. In some embodiments, the thickness T61 is in a range between about 20 A and about 200 A.

In some embodiments, the etch stop layer 3081 is an oxide film, such as silicon oxide. The etch stop layer 3081 may be formed in the same process chamber where the oxide film 104 and transitional layer 106 are formed. The etch stop layer 3081 may be formed similar to the oxide film 104.

Figure 3B:
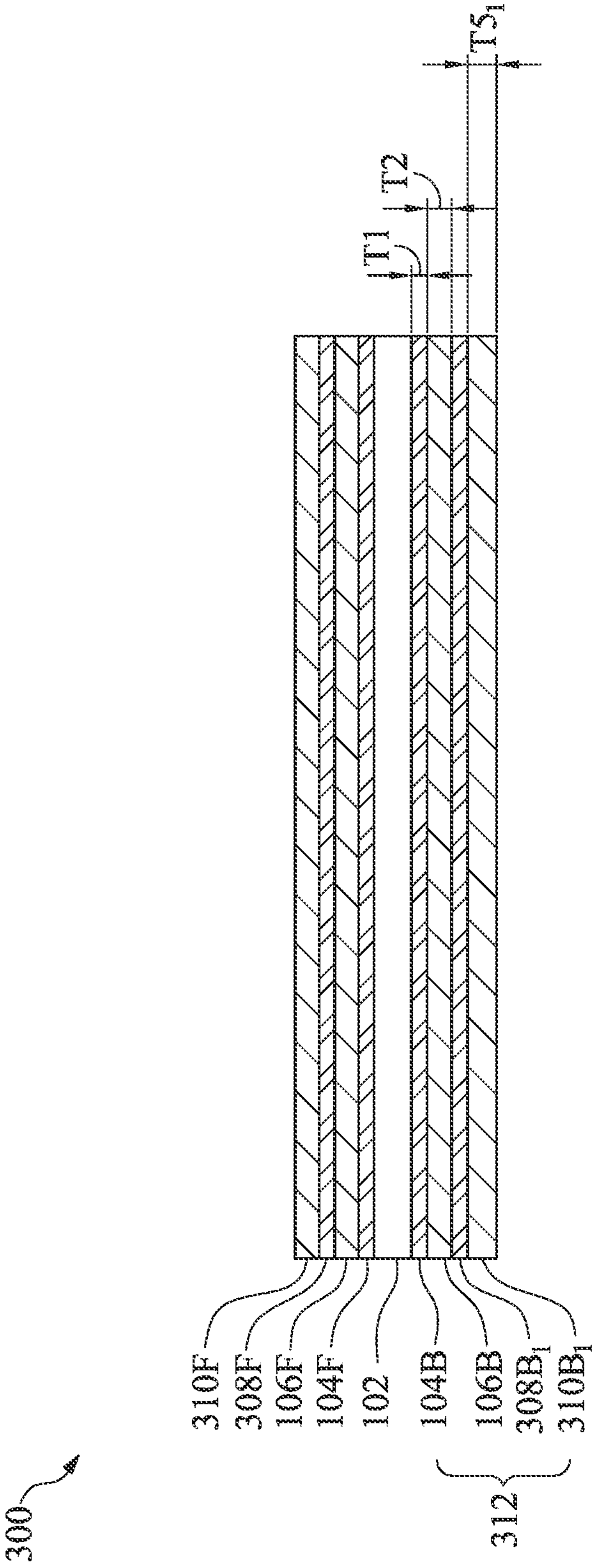

In operation 406, an enhancing layer $\mathbf{310}_1$ is formed both a front side and a back side of the substrate 300, as shown in FIG. 3B. A front side enhancing layer $\mathbf{310}F_1$ and a back side enhancing layer $\mathbf{310}B_1$ (collectively enhancing layer $\mathbf{310}_1$) are formed on the front side etch stop layer $\mathbf{308}F_1$ and the back side etch stop layer $\mathbf{308}B_1$ respectively. The front side enhancing layer $\mathbf{310}F_1$ and the back side enhancing layer $\mathbf{310}B_1$ are formed simultaneously and have substantially the same properties, such as composition and thickness. The front side enhancing layer $\mathbf{310}F_1$ and the back side enhancing layer $\mathbf{310}B_1$ are formed simultaneously in a process chamber where both the front side etch stop layer $\mathbf{308}F_1$ and the back side etch stop layer $\mathbf{308}B_1$ are exposed to the processing environment.

The enhancing layer $\mathbf{310}_1$ may be any film suitable to deposit on the back side etch stop layer $\mathbf{308}B_1$ such that the back side oxide film 104B, the back side transitional layer 106B, the back side etch stop layer $\mathbf{308}B_1$, and the back side enhancing layer $\mathbf{310}B_1$ form the back side film stack 312. The back side film stack 312 may remain on the wafer 102 during most processing steps to provide protection. In some embodiments, the back side film stack 312 may also function as a stress modulation or warpage adjustment film to achieve a certain warpage in the device substrate 300.

The back side enhancing layer $\mathbf{310}B_1$ has a thickness $T\mathbf{5}_1$. In some embodiments, the thickness $T\mathbf{5}_1$ is in a range between about 200 A and about 2000 A. In some embodiments, the back side enhancing layer $\mathbf{310}B_1$ may include a suitable dielectric film, such as a semiconductor nitride or a semiconductor oxide. In some embodiments, the back side enhancing layer 310B may include silicon nitride ($Si_3N_4$ or SiN), silicon oxynitride (SiON), Si-rich silicon nitride, a N-rich silicon nitride, tetraethylorthosilicate (TEOS), silicon oxide, or the like. In some embodiments, the back side enhancing layer $\mathbf{310}B_1$ may be a nitride of a semiconductor material, such as a silicon nitride. The back side enhancing layer $\mathbf{310}B_1$ may be formed by flowing precursors containing a nitrogen source and a semiconductor source.

In some embodiments, the enhancing layer $\mathbf{310}_1$ and the transitional layer 106 may include the same material, such as a silicon nitride. In some embodiments, composition of the back side enhancing layer $\mathbf{310}B_1$ may be selected according to the desired stress level. In some embodiments, the enhancing layer 310 and the transitional layer 106 may be deposited in the same or similar processing chamber. For example, the enhancing layer 310 and the transitional layer 106 may be deposited in the same or similar batch processing chamber.

Similar to the operation 205 in the method 200, an optional operation 405 may be formed between the operations 404 and 406. As illustrated in FIGS. 8B and 8C, the transitional layer 106 is deposited while the substrate 300 is disposed on the support tower 800 at the first position, and the substrate 300 is rotated an angle alpha and disposed on the support tower 800 at the second position to deposit the enhancing layer $\mathbf{310}_1$. In some embodiments, the angel alpha is in a range between about 20 degrees and 60 degrees.

Figure 3C:
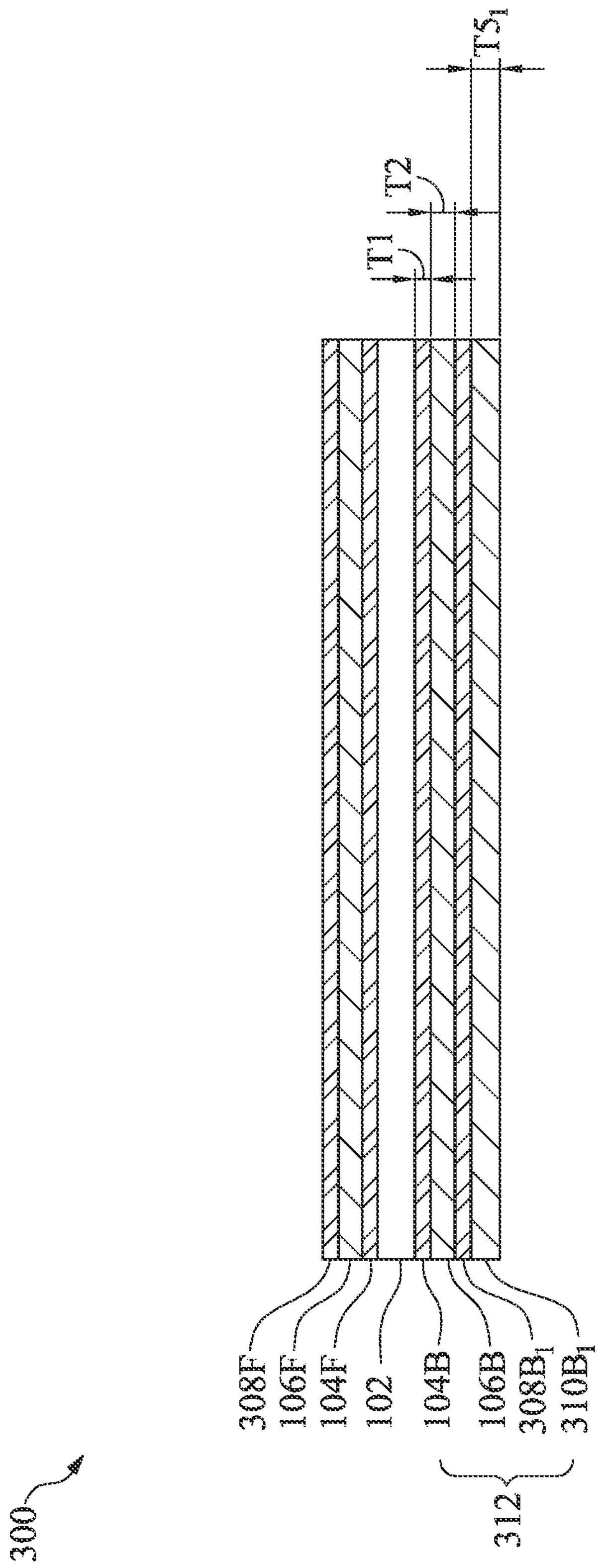

In operation 408, the front side enhancing layer $\mathbf{310}F_1$ is removed while the back side enhancing layer $\mathbf{310}B_1$ remains intact, as shown in FIG. 3C. In some embodiments, the front side enhancing layer $\mathbf{310}F_1$ may be removed with a dry etch process. Suitable processes in operation 408 may be similar to the processes described in operation 208 in the method 200. After operation 408, the front side etch stop layer 308$F_1$ is exposed while the back side etch stop layer 308$B_1$ remains in the back side film stack 312.

Figure 3D:
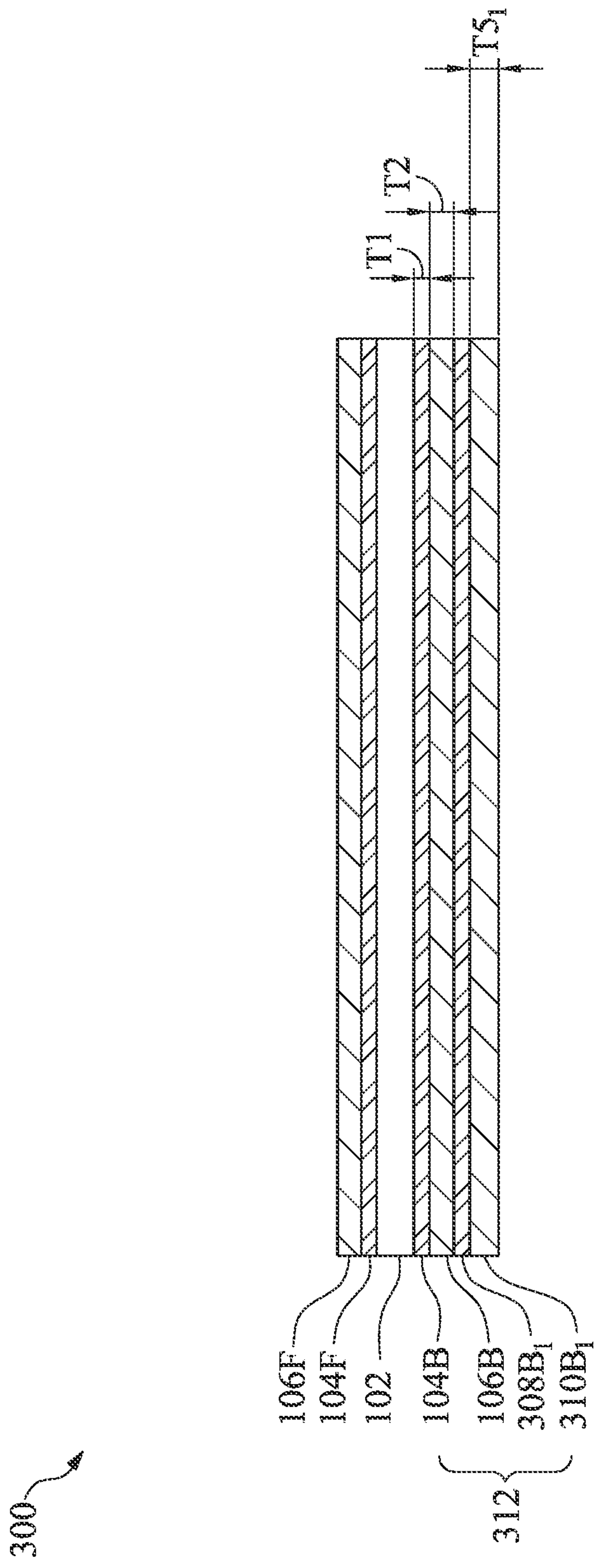

In operation 410, the front side etch stop layer 308$F_1$ is removed to expose the front side transitional layer 106F for subsequent processing as shown in FIG. 3D. In some embodiments, the front side etch stop layer 308$F_1$ may be removed by a wet etch process, such as a dilute HF dip process. Alternatively, a plasma etching process may be carried out with a conventional dry etching chemistry such as HBr, and $Cl_2$ to minimize damage to the front side transitional layer 106F.

Figure 3E:
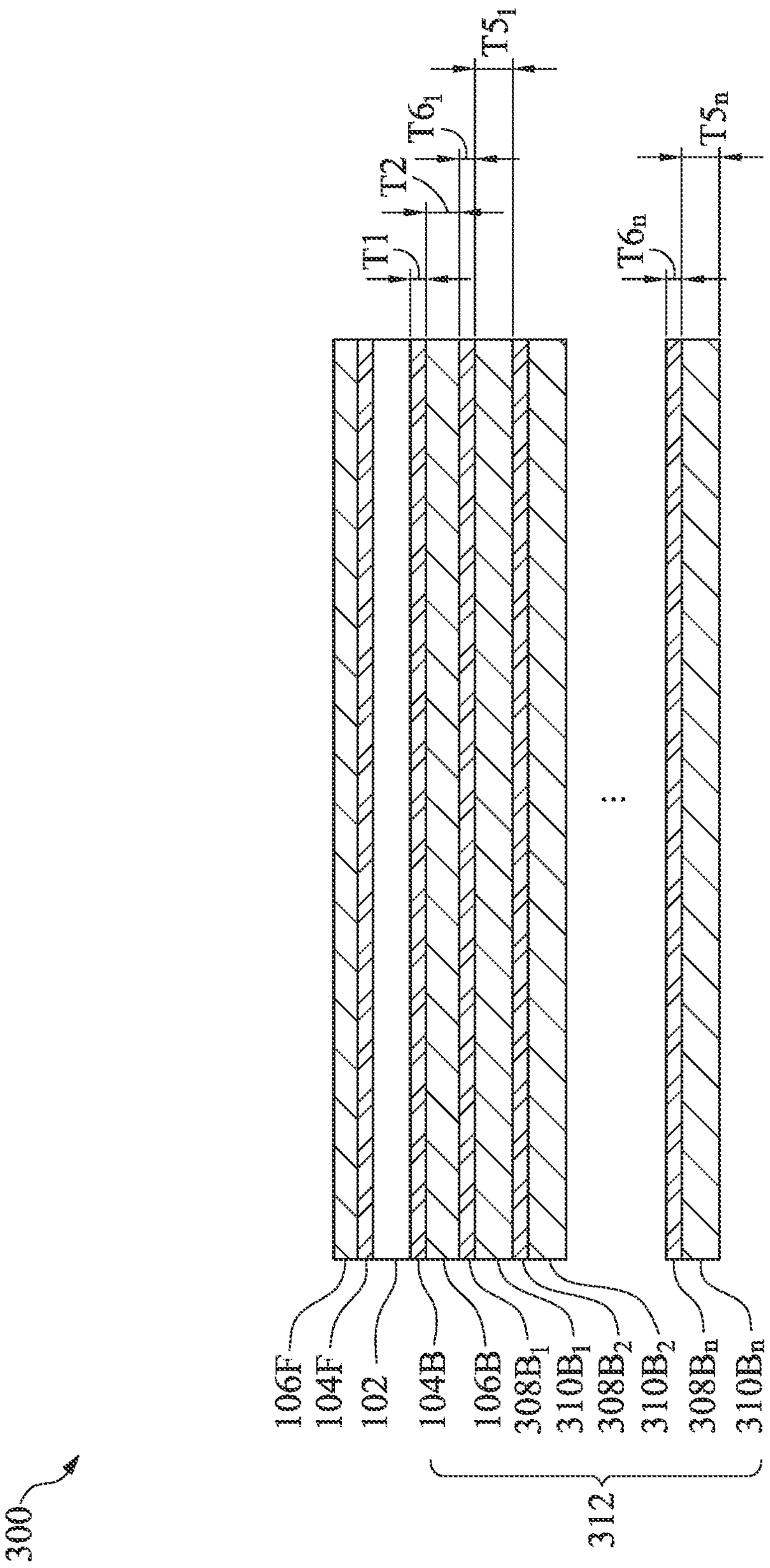

At this stage, a processing sequence is performed to fabricate a circuitry structure 120 on the front side transitional layer 106F. In some embodiments, the operations 404, 406, 408, and 410 may be repeated one or more time to increase thickness of the back side film stack 312 as shown in FIG. 3E. With each cycle of the operations 404, 406, 408, and 410, a pair of etch stop layer 308$B_n$ and enhancing layer 310$B_n$ is added to the back side film stack 312. As shown in FIG. 3E, the back side film stack 312 may include n pairs of back side etch stop layer 308$B_1$-308$B_n$ and back side enhancing layer 310$B_1$-310$B_n$ stacked together, where n is equal to or greater than 1. The backside etch stop layer 308$B_1$-308$B_n$ and the back side enhancing layer 310$B_1$-310$B_n$ are alternative arranged. The number of pairs of etch stop layers 308$B_n$ and back side enhancing layer 310$B_n$ may be selected according to the process requirement.

The back side etch stop layer 308$B_n$ may have a thickness $T6_n$. In some embodiments, the back side etch stop layers 308$B_1$-308$B_n$ may have the same thickness. The back side enhancing layer may have a thickness $T5_n$. In some embodiments, the back side enhancing layer 310$B_1$-310$B_n$ may have substantially the same thickness, as shown in FIG. 3G. Alternatively, the thickness $T5_1$-$T5_n$ of the back side enhancing layer 310$B_1$-310$B_n$ may be different. In some embodiments, the thickness $T5_n$ of the back side enhancing layer 310$B_n$ may increase with n, i.e. $T5_1<T5_n< \ldots <T5_n$, as shown in FIG. 3H.

The etch stop layers 308$B_n$ and back side enhancing layer 310$B_n$ may be suitable dielectric materials having etch selectivity with each other. In some embodiments, the back side etch stop layer 308$B_1$-308$B_n$ may include one or more dielectric material, such as silicon oxide, silicon oxynitride, silicon nitride, or the like. The back side enhancing layer 310$B_1$-310$B_n$ may include one or more dielectric material, such as silicon nitride, silicon oxynitride, silicon oxide, or the like. In some embodiments, the back side etch stop layers 308$B_1$-308$B_n$ may be formed from the same material. Alternatively, the back side etch stop layers 308$B_1$-308$B_n$ may be formed from different materials. In some embodiments, the back side enhancing layer 310$B_1$-310$B_n$ may be formed from the same material. Alternatively, the back side enhancing layer 310$B_1$-310$B_n$ may be formed from different materials.

Figure 3F:
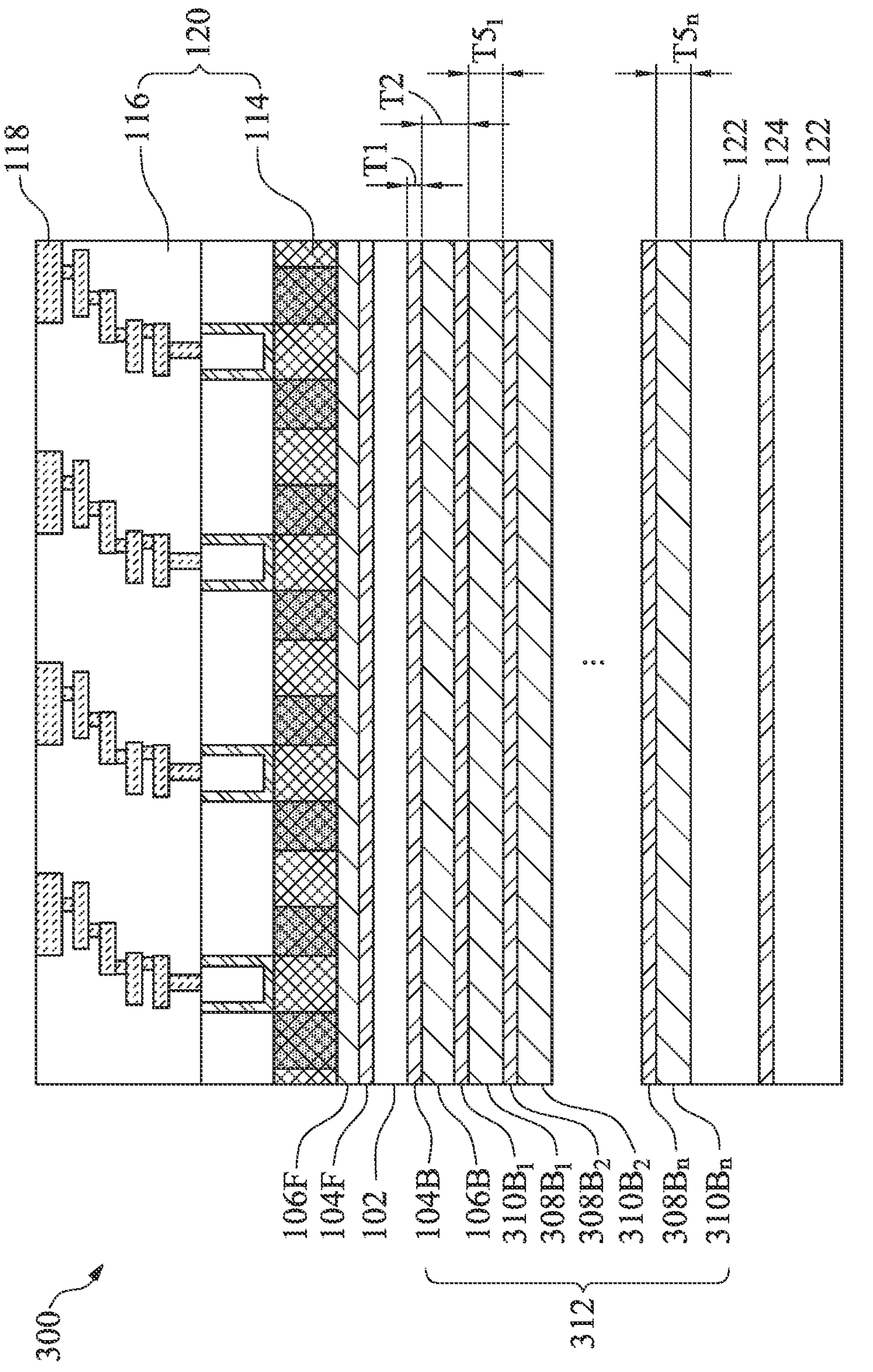
Figure 3G:
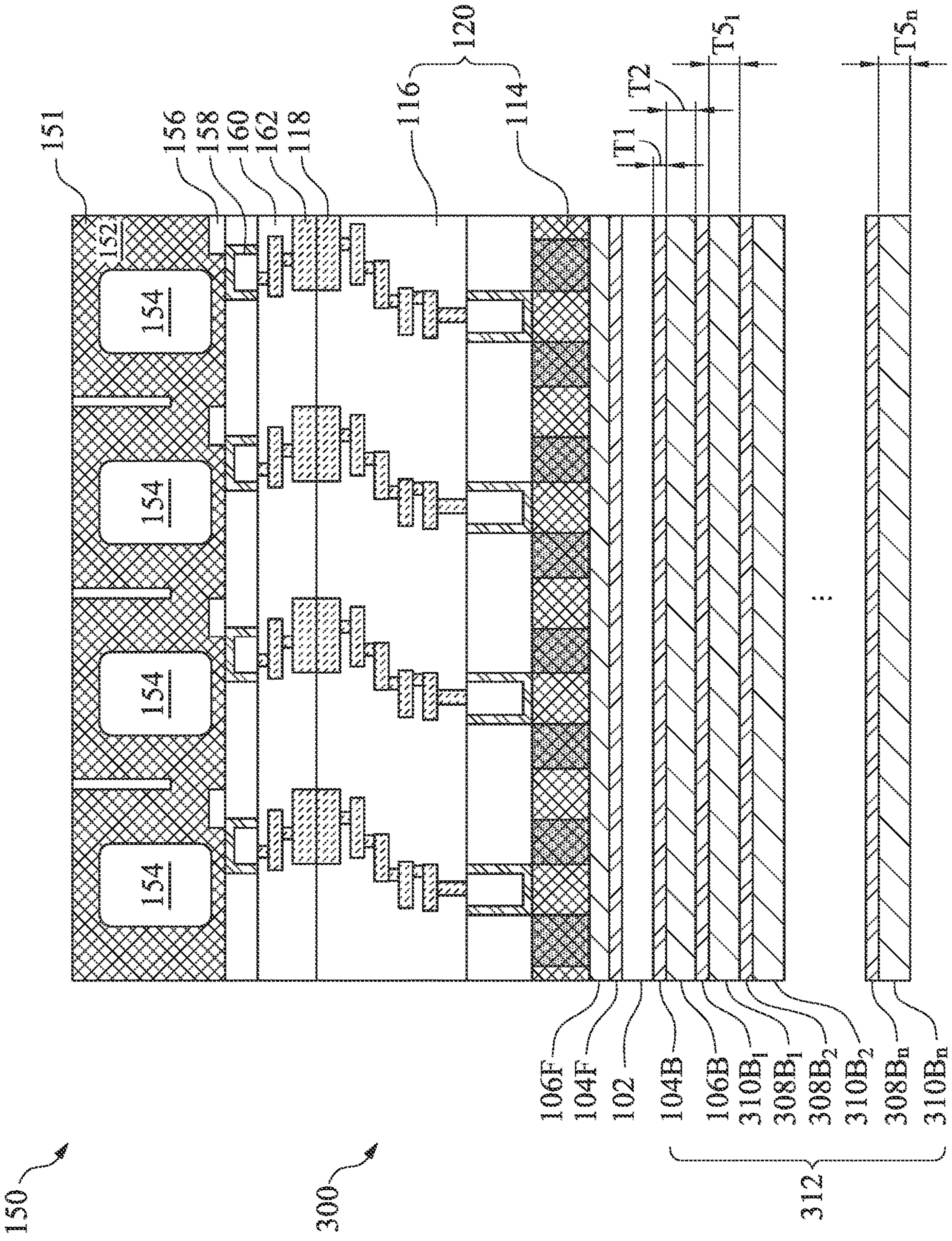

After the back side film stack 312 reaches a target thickness, operation 212 may be performed to fabricate the circuitry structure 120 on the front side transitional layer 106F, as shown in FIG. 3F. Operation 214 may then be performed to bond the device substrate 300 with another semiconductor substrate, such as the semiconductor substrate 150, as shown in FIG. 3G.

Figure 3H:
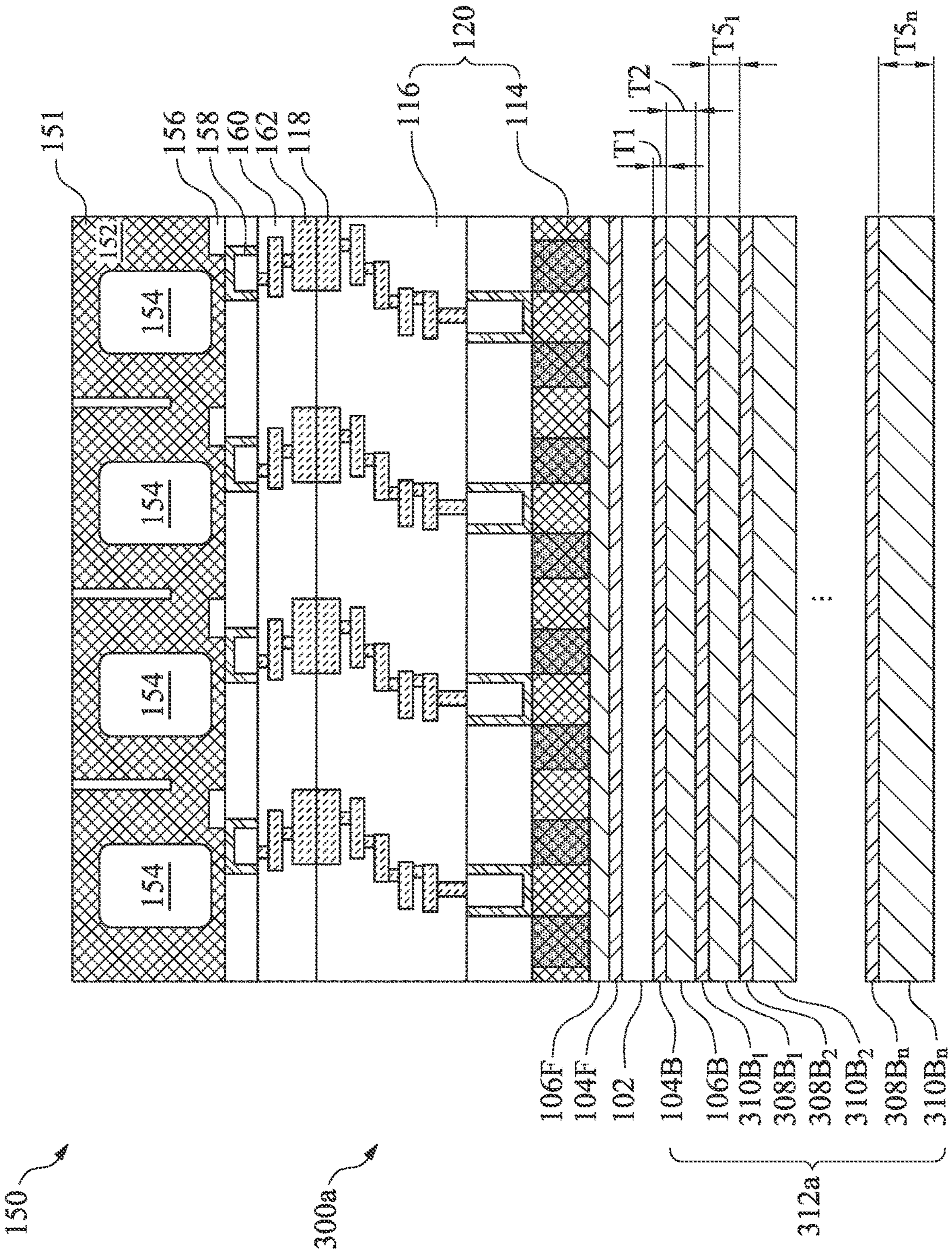

FIG. 3H schematically illustrates a device substrate 300*a* having a back side film stack 312*a*. The back side film stack 312*a* includes n pairs of the back side etch stop layer 308$B_n$ and the back side enhancing layer 310$B_n$. The thickness $T5_n$ of the back side enhancing layer 310$B_n$ increases from $T5_1$ to $T5_n$.

As shown in FIG. 3E, the back side film stack 312 may include n pairs of back side etch stop layer 308$B_1$-308$B_n$ and back side enhancing layer 310$B_1$-310$B_n$ stacked together, where n is equal to or greater than 1.

FIGS. 5A-5E are schematic cross-sectional views of a device substrate 500 being fabricated according to embodiments of the present disclosure. FIG. 6 is a flow chart of a method 600 for fabricating a semiconductor substrate according to embodiments of the present disclosure. The device substrate 500 may be fabricated according to the method 600. The method 600 is similar to the method 200, except the method 600 includes an operation 603 after operation 202. The device substrate 500 is similar to the device substrate 300 except that the device substrate 500 includes a back side transitional layer with implantation.

The method 600 begins with the operation 202, as described above and shown in FIG. 5A. The oxide film 104 and transitional layer 106 are sequentially deposited on the front side 102F and the back side 102B of the wafer 102.

Figure 5A:
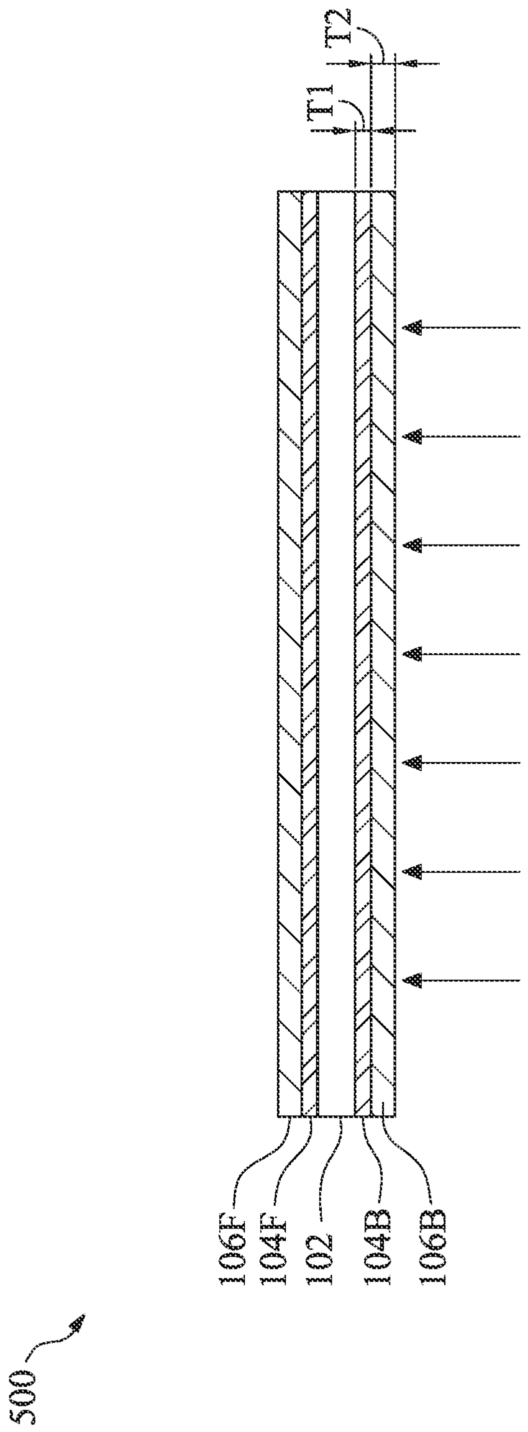
FIGS. 5A-5E are schematic cross-sectional views of a semiconductor substrate being fabricated according to embodiments of the present disclosure.
Figure 5B:
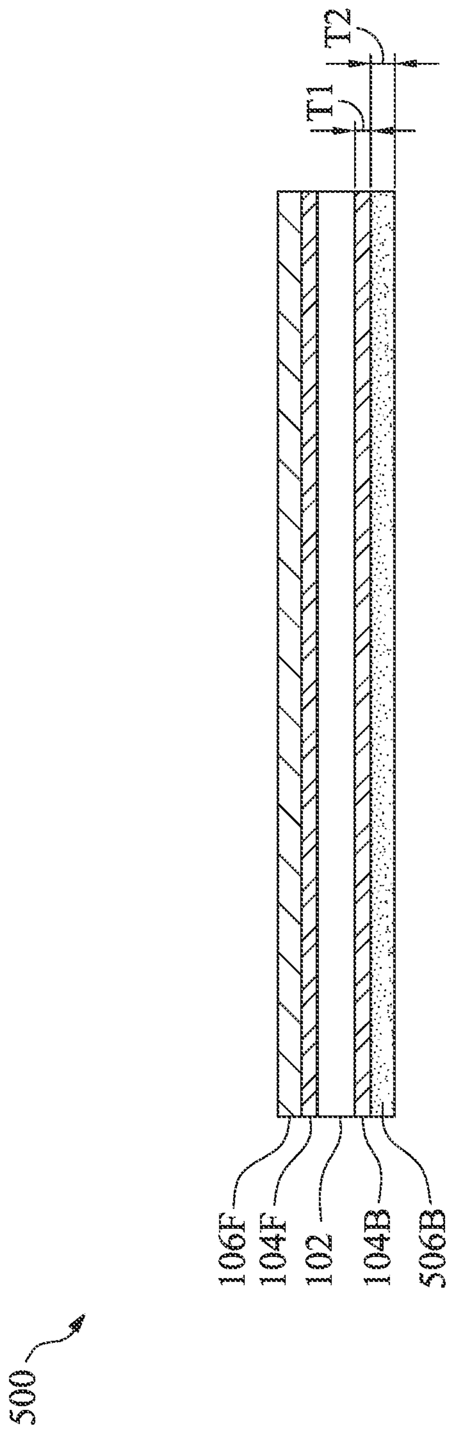
Figure 6:
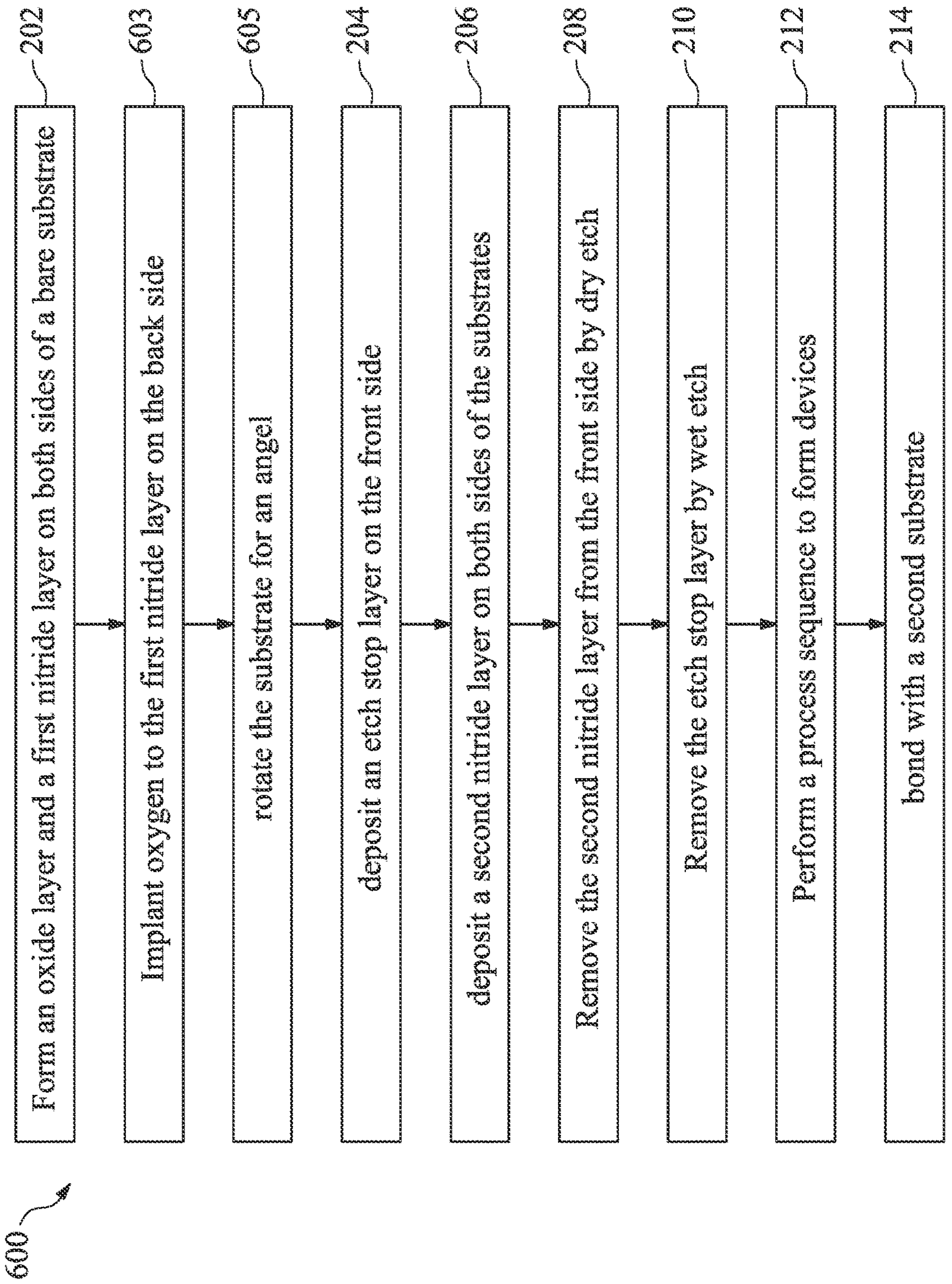
FIG. 6 is a flow chart of a method for fabricating a semiconductor substrate according to embodiments of the present disclosure.

In operation 603 of the method 600, an implantation is performed on the back side transitional layer 106B, as shown in FIG. 5A. In some embodiments, one or more impurity may be implanted to the back side transitional layer 106B to alternate the crystalline structure and resulting in an implanted layer 506B, as shown in FIG. 5B. In some embodiments, the implanted layer 506B may have a thickness in a range between about 20 A and about 60 A. The implanted layer 506B improves adhesion between the wafer 102 and the subsequently deposited dielectric layer in a back side film stack. In some embodiments, oxygen may be implanted to the back side transitional layer 106B. With the implanted oxygen, the implanted layer 506 provides better adhesion between the wafer 102 and the subsequent deposited layers.

Figure 5C:
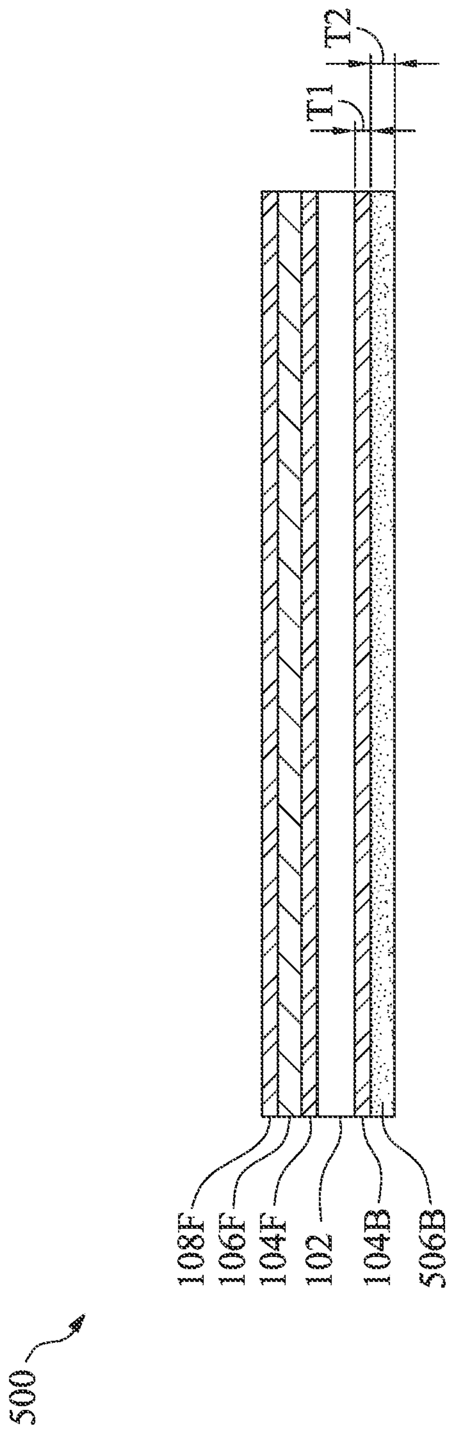

After operation 603, operation 204 is performed to deposit the etch stop layer 108 on the front side transitional layer 106F, as shown in FIG. 5C.

Figure 5D:
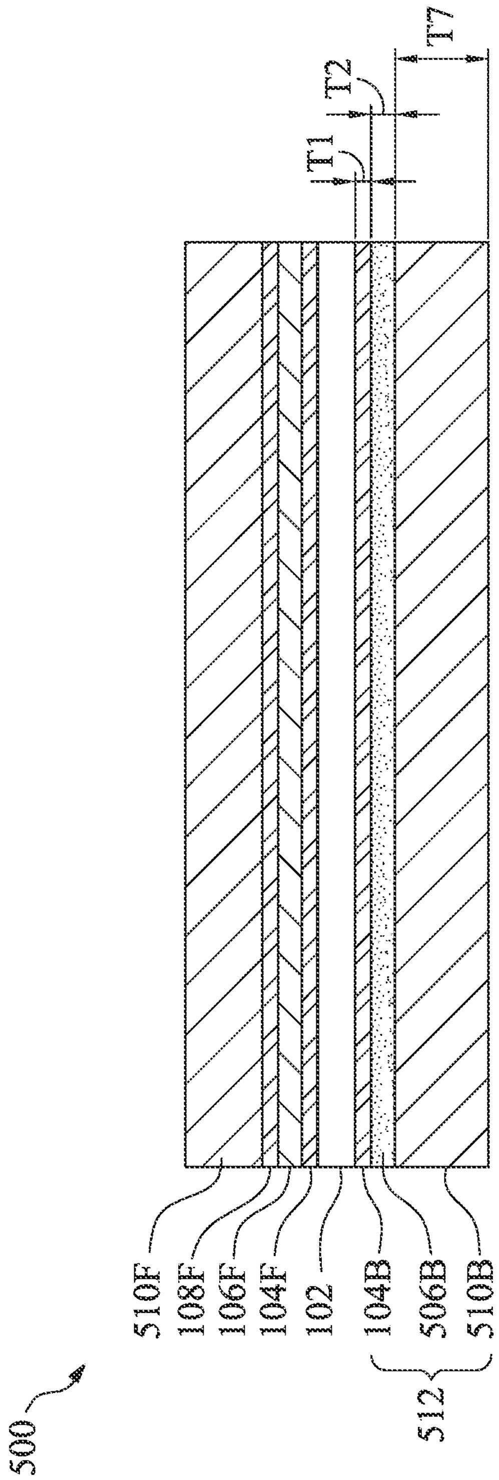

In operation 206, an enhancing layer 510 is formed both a front side and a back side of the substrate 500, as shown in FIG. 5D. A front side enhancing layer 510F and a back side enhancing layer 510B (collectively enhancing layer 510) are formed on the etch stop layer 108 and the implanted layer 506B respectively. The front side enhancing layer 510F and the back side enhancing layer 510B are formed simultaneously and have substantially the same properties, such as composition and thickness. The front side enhancing layer 510F and the back side enhancing layer 510B are formed simultaneously in a process chamber where both sides of the device substrate 500 are exposed to the processing environment. The enhancing layer 510 is similar to the enhancing layer 110 except that the enhancing layer 510 may be deposited at a greater thickness without peeling because of the implanted layer 506B. The back side enhancing layer 510B has a thickness T7. In some embodiments, the thickness T7 is in a range between about 200 A and about 2000 A. A back side film stack 512 is formed on the back side of the wafer 102. The back side film stack 512 comprises the back side oxide film 104B, the back side implanted layer 506B and the back side enhancing layer 510B.

Operations 208 and 210 are subsequently performed to remove the front side enhancing layer 510F and the etch stop layer 108 from the front side with the back film stack 512 remaining intact.

Figure 5E:
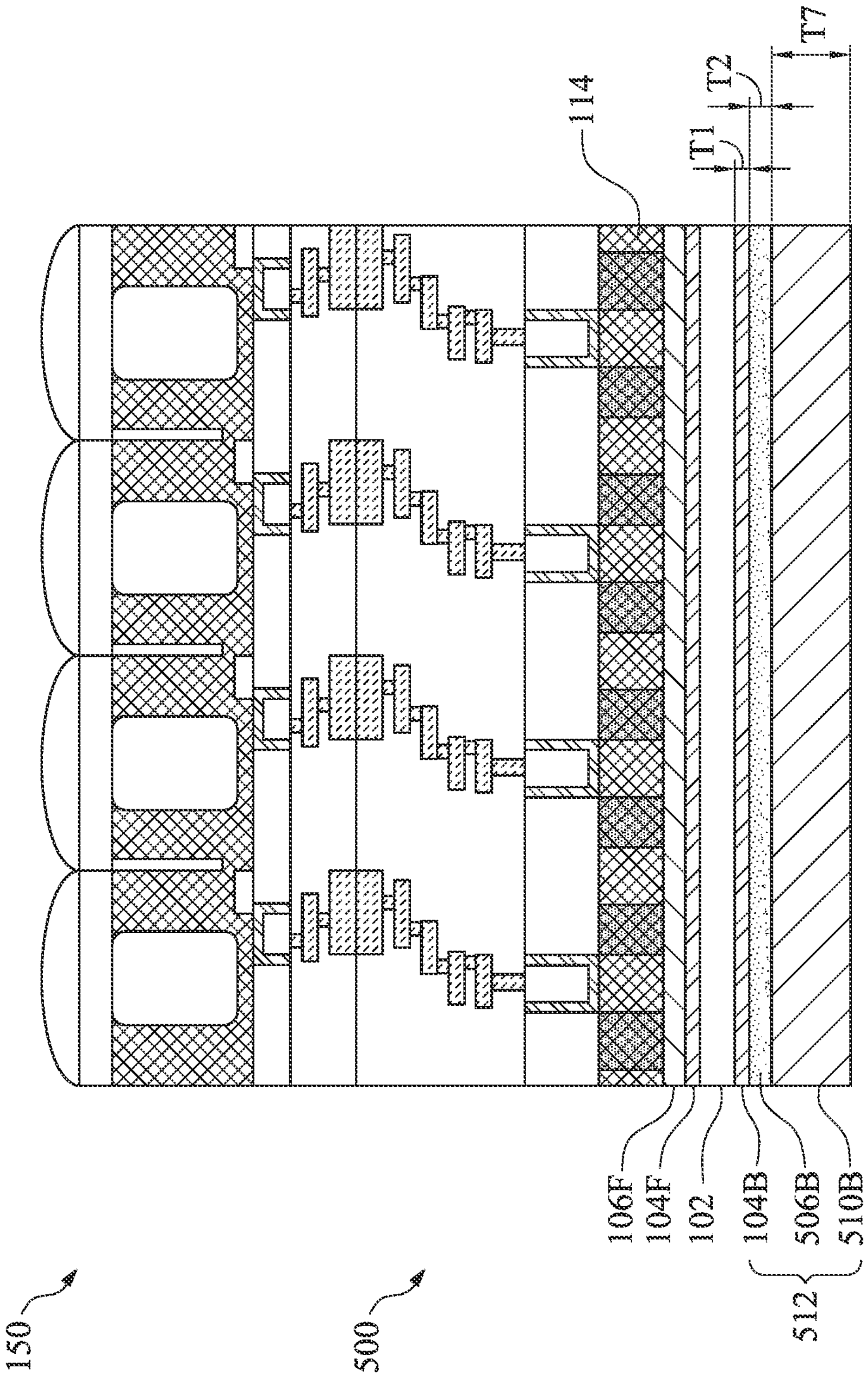

Operations 212 and 214 may be subsequently performed to form the circuitry structure 120 and bond with the second semiconductor substrate 150, as shown in FIG. 5E.

Similarly, the operation 603 may be added to the method 400 after the operation 202 and before the operation 404. In operation 603, the implanted layer 506B is formed from the back side transitional layer 106B.

Figure 7A:
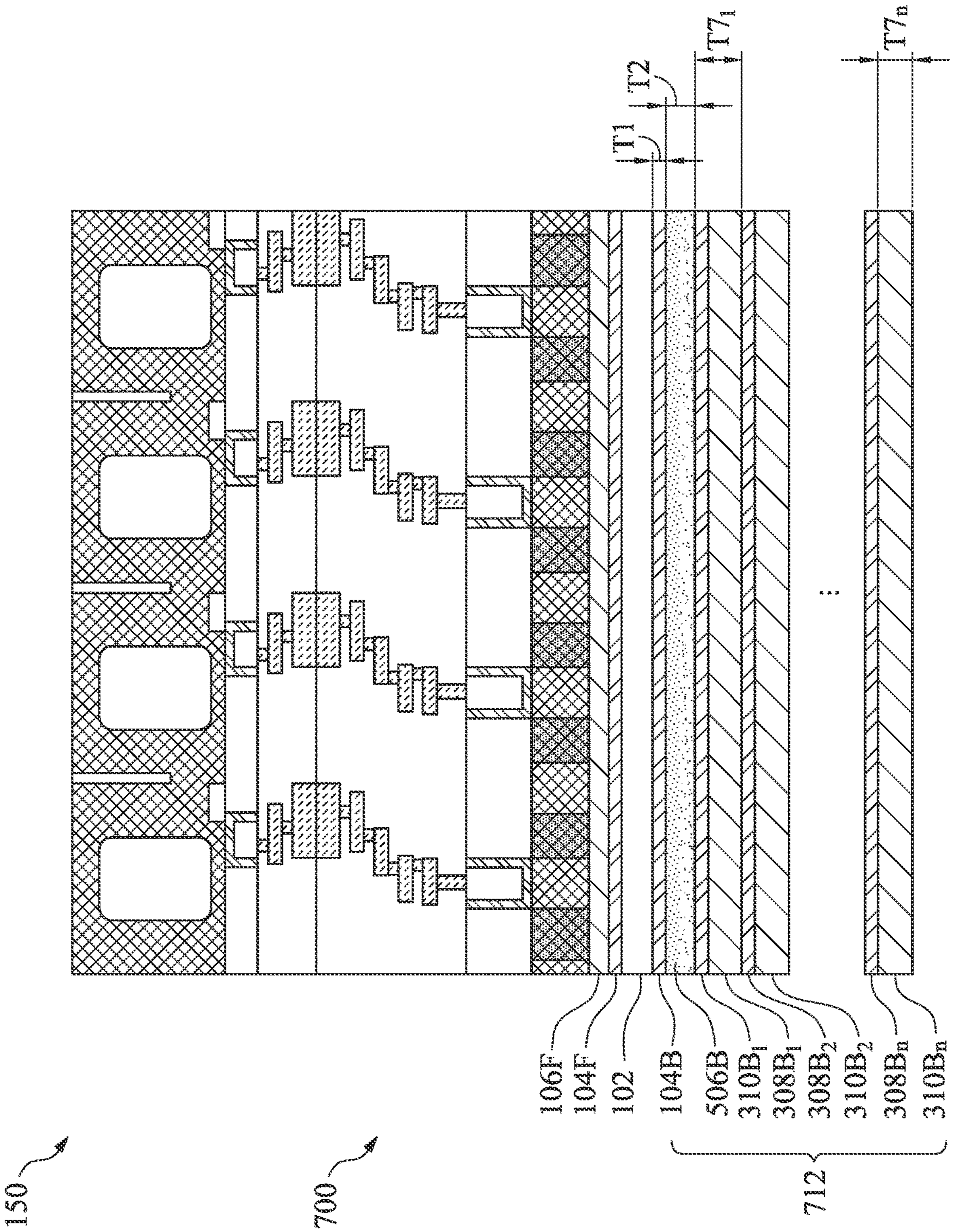
FIGS. 7A and 7B are schematic cross-sectional views of bonded substrates with back side film stacks according to embodiments of the present disclosure.

FIG. 7A is schematic cross-sectional views of a semiconductor substrate 700 with a back side film stack 712 according to embodiments of the present disclosure. The back side film stack 712 is similar to the back side film stack 312 except that the back side film stack 712 includes the implanted layer 506B in place of the back side transitional layer 106B.

Figure 7B:
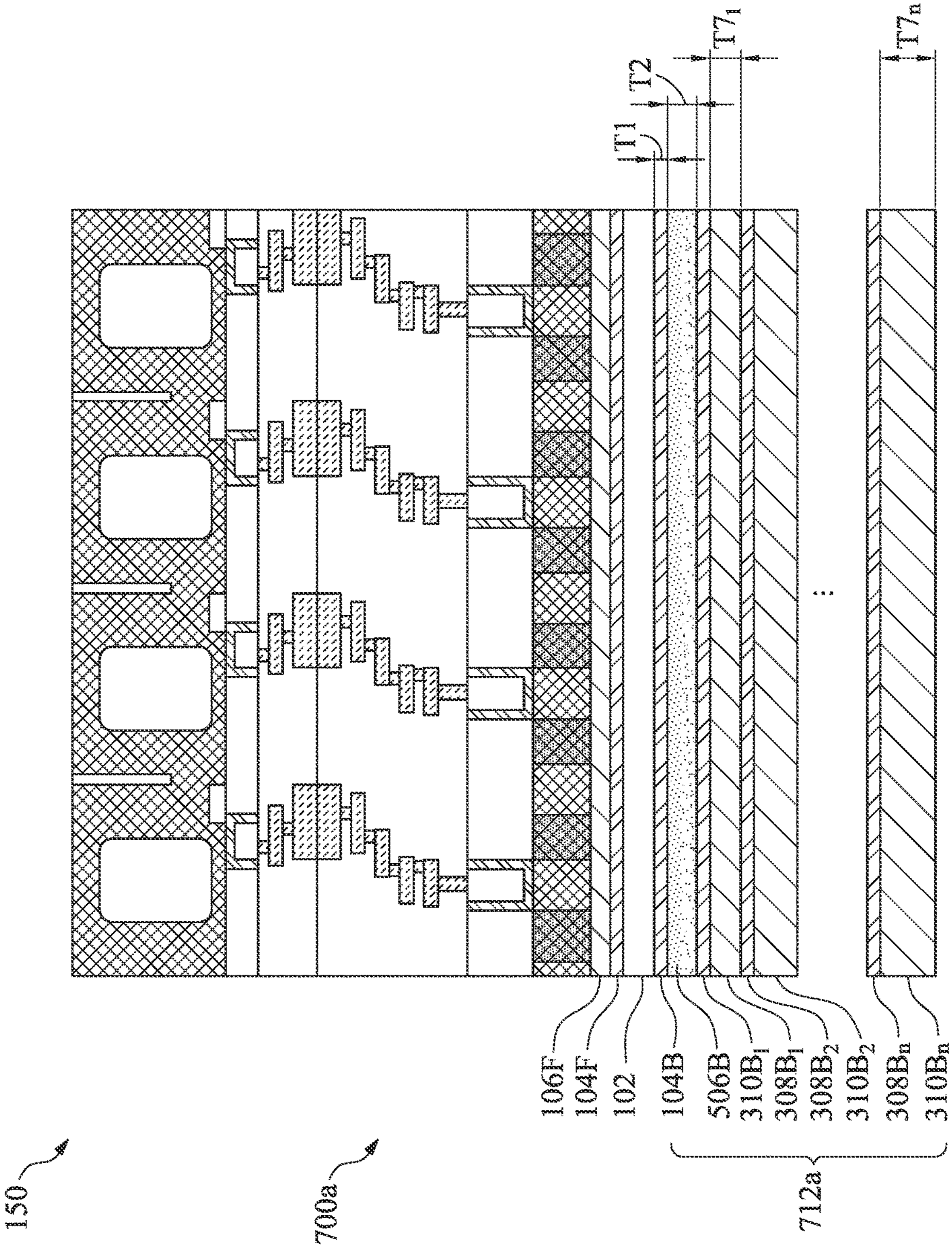

FIG. 7B is schematic cross-sectional views of a semiconductor substrate 700*a* with a back side film stack 712*a* according to embodiments of the present disclosure. The back side film stack 712*a* is similar to the back side film stack 312*a* except that the back side film stack 712*a* includes the implanted layer 506B in place of the back side transitional layer 106B. Unlike the back side film stack 712, the back side film stack 712*a* includes n pairs of the back side etch stop layer $\mathbf{508}B_n$ and the back side enhancing layer $\mathbf{510}B_n$, which has thickness $T7_n$ increases from $T7_1$ to $T7_n$.

Even though the above examples demonstrate bonding image sensor chips and logic chips at wafer-to-wafer level, embodiments of the present disclosure may also benefit die to die bonding between image sensor chips and logic chips, or any suitable chips.

The back side film stack according to the present disclosure may also be used to modulate stress and wafer warpage during various packaging schemes to improve bonding adhesion and device performance.

Figure 9A:
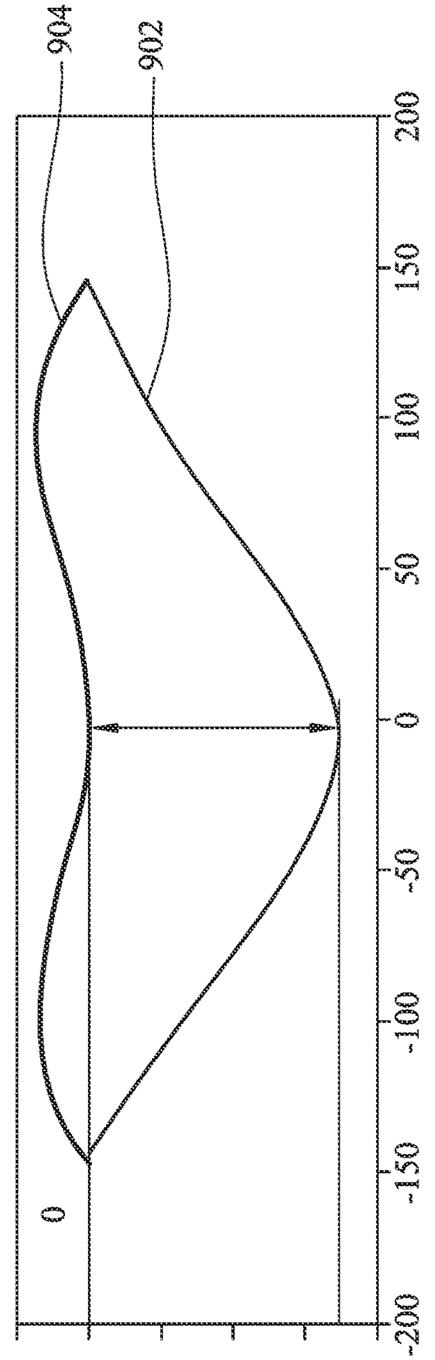
FIGS. 9A and 9B schematically demonstrate warpage modulation effects using back side film stacks according to embodiments of the resent disclosure.

FIG. 9A includes warpage profiles of substrates with and without the back side film stacks according to the present disclosure. In FIG. 9A, the x-axis represents locations along a diameter of a substrate, and the y-axis represents a local warpage value. A substrate has a positive warpage when the center region protrudes over the edge region. A substrate has a negative warpage when the center region dips from the edge region. FIG. 9A includes a warpage profile 902 of a conventional semiconductor substrate and a warpage profile 904 of a semiconductor substrate with a back side film stack, such as the back side film stack 112, 312, 312*a*, 512, 512*a*, 712, 712*a*. As shown in the warpage profile 904, a conventional substrate has a significant negative warpage near the center of the substrate. The warpage profile 904 on the other hand has a smaller positive warpage. The warpage profile 902, 904 demonstrate that the back side film stack may modulate warpage. In some embodiments, the back side film stack according to the present disclosure may be used to induce a positive warpage in a substrate.

Figure 9B:
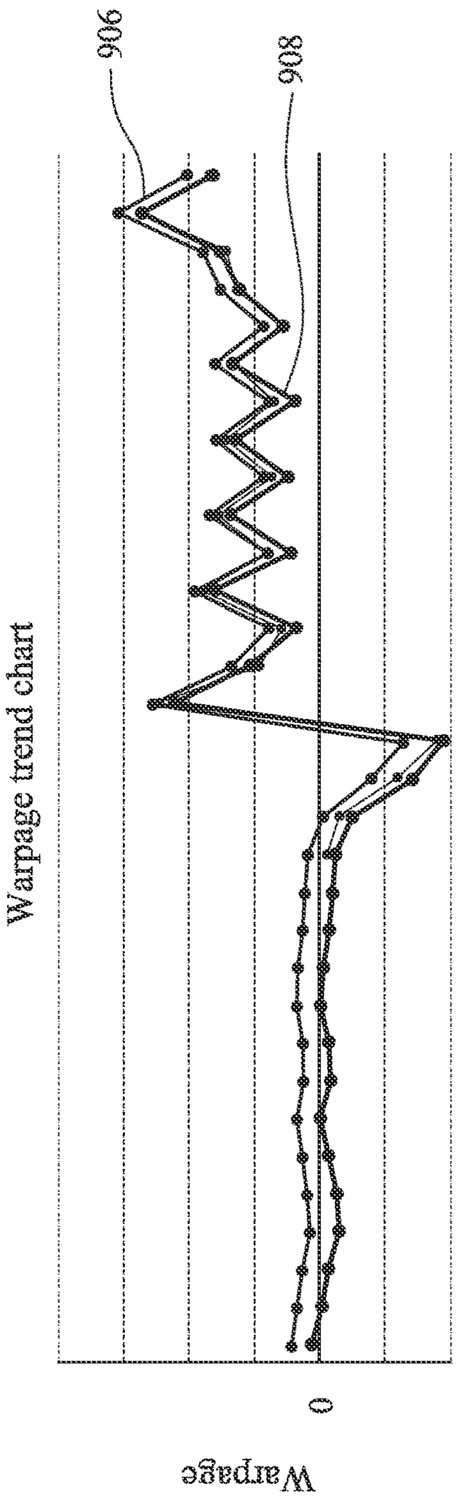

FIG. 9B includes warpage trends along processing steps of substrates with and without the back side film stacks according to the present disclosure. In FIG. 9B, the x-axis represents processing steps in a processing sequence, and the y-axis represents an average warpage of the substrate. FIG. 9B includes a warpage trend 906 of a conventional semiconductor substrate and a warpage trend 908 of a semiconductor substrate with a back side film stack, such as the back side film stack 112, 312, 312*a*, 512, 512*a*, 712, 712*a*. Comparing the warpage trends 906 and 908, it is obvious that the back side film stack according to the present disclosure may reduce warpage during process sequence.

FIGS. 10A-10J schematically demonstrate warpage modulation in a Chip-on-Wafer-on-Substrate (CoWoS) package 1000 according to the present disclosure.

Figure 10A:
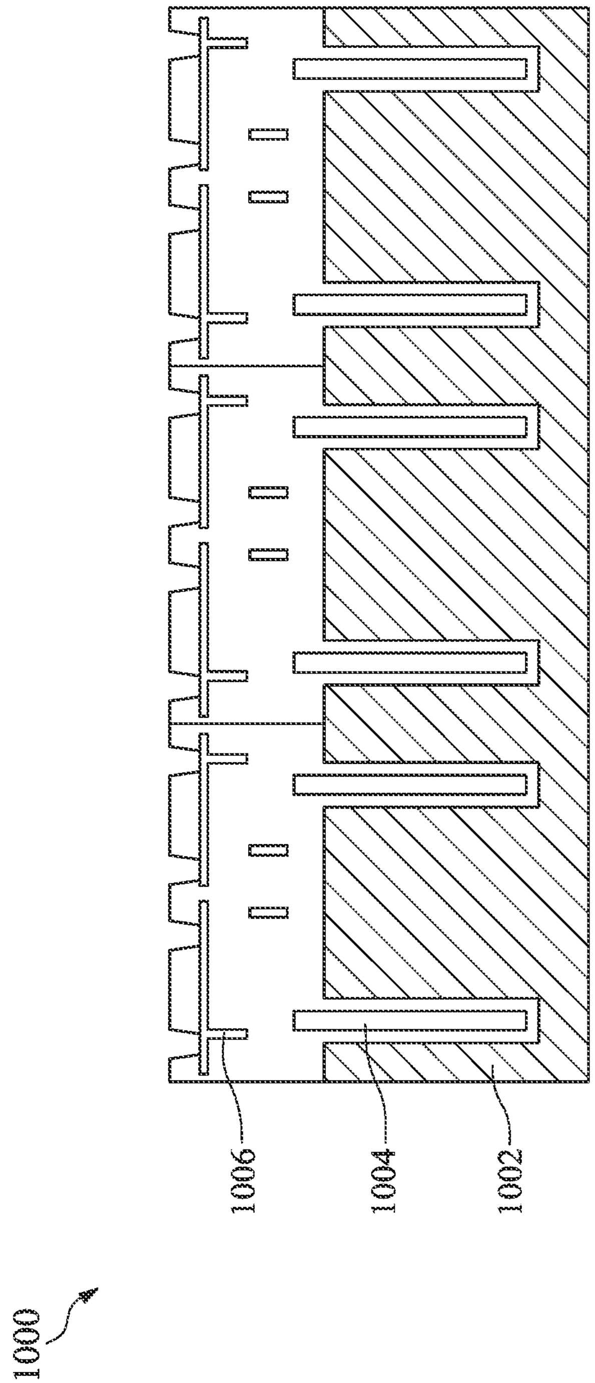
FIGS. 10A-10K schematically demonstrate warpage modulation according to the present disclosure in a Chip-on-Wafer-on-Substrate (CoWoS) packaging.

In FIG. 10A, an interposer substrate 1002 is provided. The interposer substrate 1002 having through substrate via (TSV) 1004 formed therein. An interconnect structure 1006 is formed on a front side of the interposer substrate 1002.

Figure 10B:
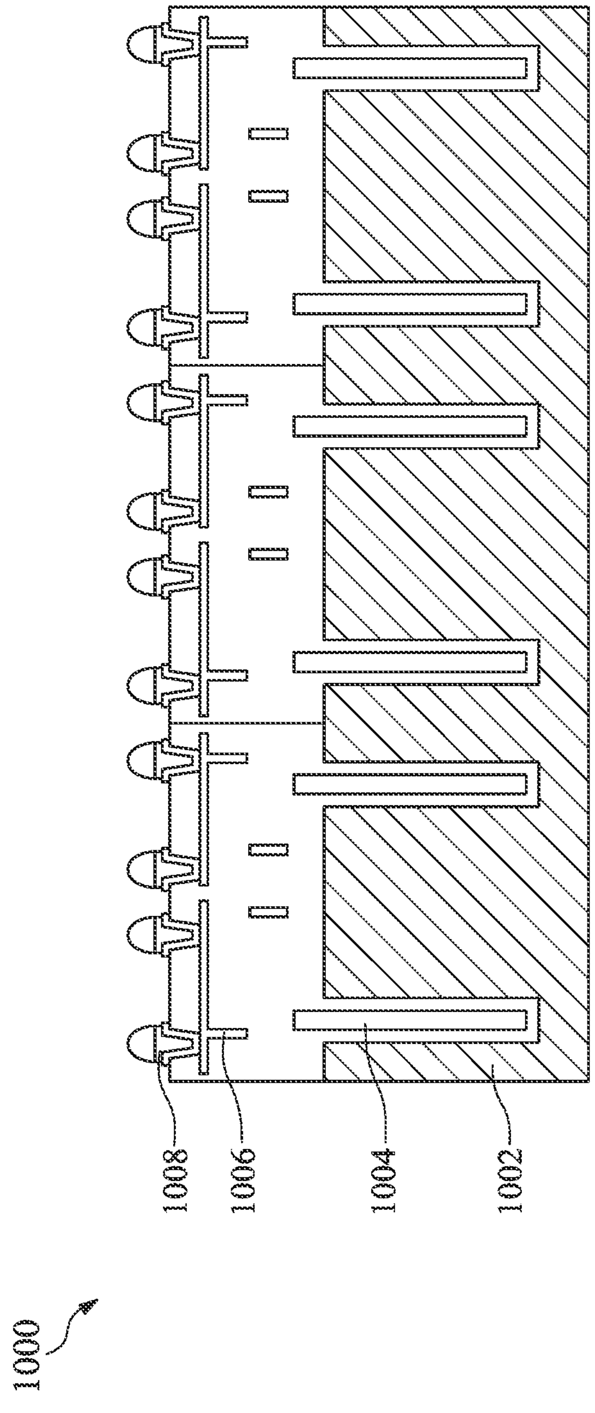

In FIG. 10B, a plurality of pumps and conductive connectors 1008 are formed over the interconnect structure 1006. In some embodiments, the pumps and conductive connectors 1008 may be copper pillars.

Figure 10C:
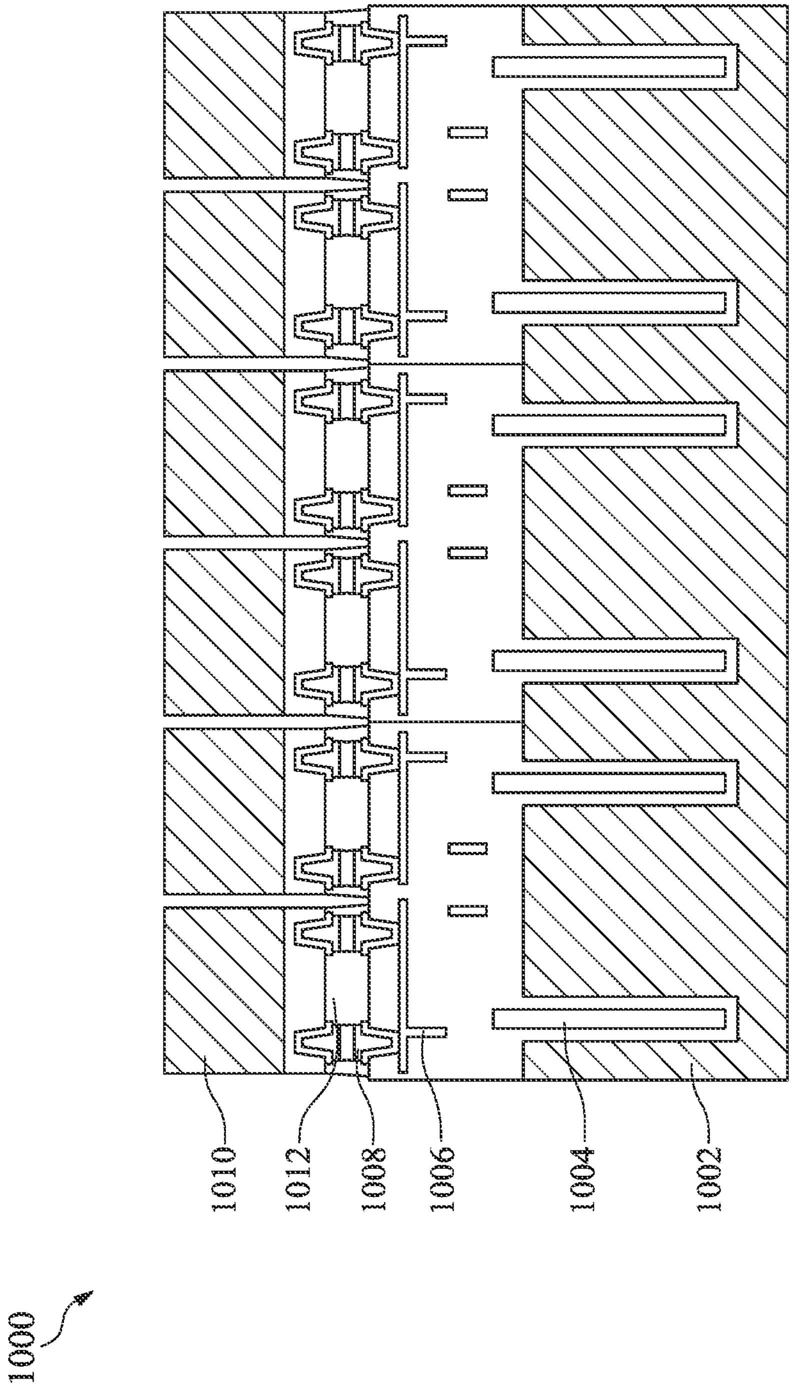

In FIG. 10C, a front size die to wafer bonding is performed to bond a plurality of integrated circuit dies 1010 via the pumps and conductive connectors 1008.

An underfill 1012 may be coated over the interconnect structure 1006 prior to bonding the integrated circuit dies 1010.

Figure 10D:
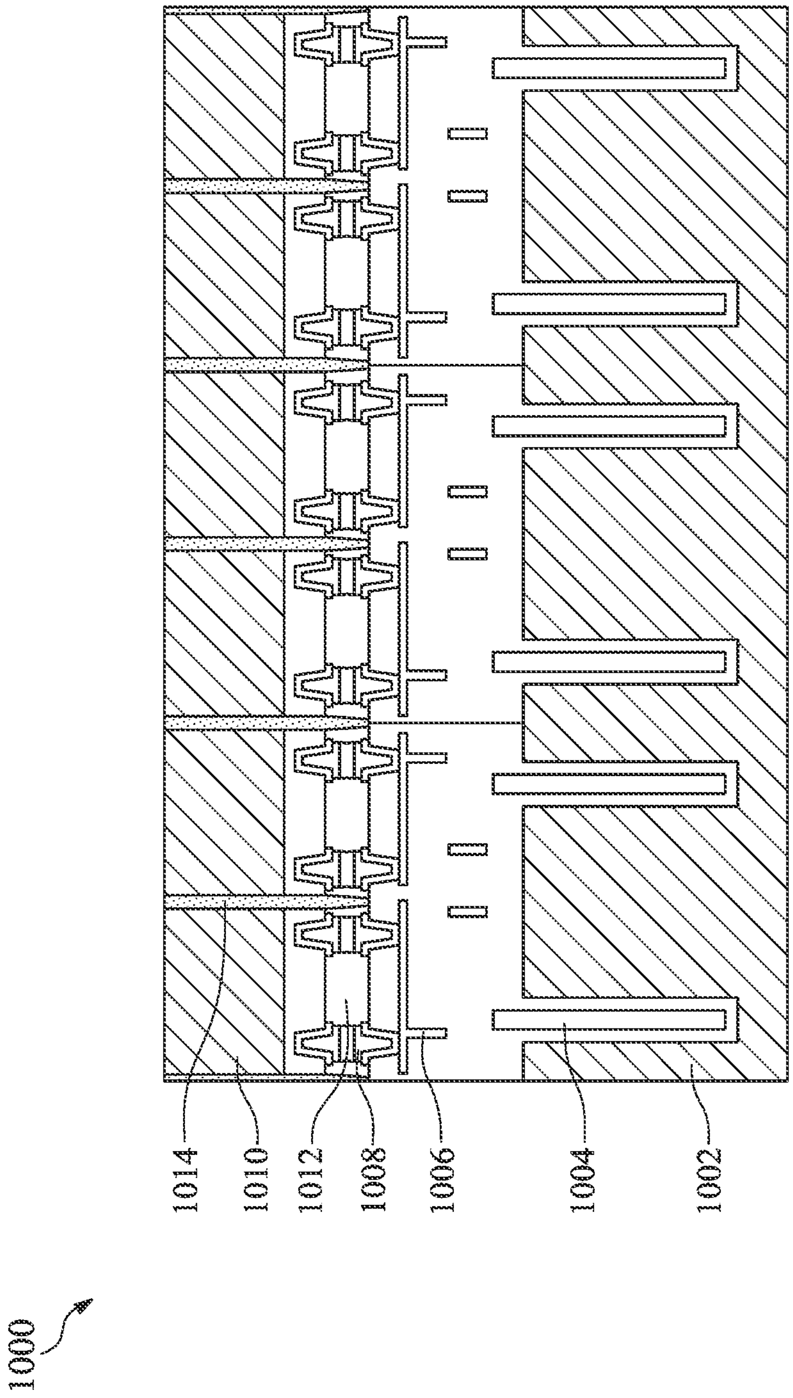

In FIG. 10D, a gap-filling process is performed to encapsulate the integrated circuit die 1010 in an encapsulant 1014. After formation, the encapsulant 1014 encapsulates the integrated circuit dies 1010, and the interconnect structure 1006. After the encapsulant 1014 is deposited, a planarization process is performed to level a back-side surface of the integrated circuit dies 1010 with the top surface of the encapsulant 1014.

Figure 10E:
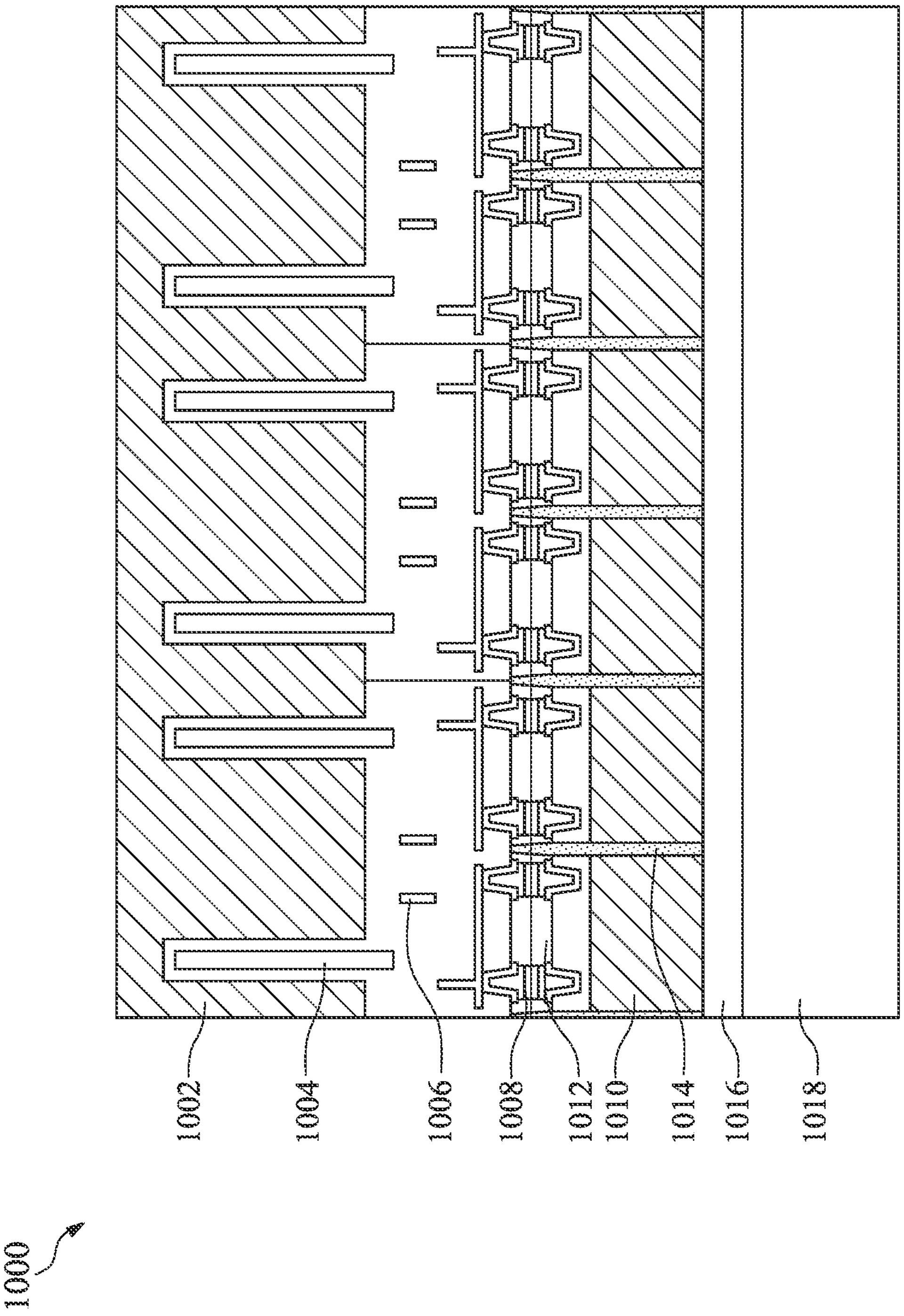

In FIG. 10E, an adhesive molding material 1016 is applied to the top surface of the integrated circuit dies 1010 and the encapsulant 1014. A carrier substrate 1018 is then attached to the molding material 1016. The carrier substrate 1018 provides mechanical support for the interposer substrate 1002 and the integrated circuit dies 1010 during intermediary operations of the fabrication process. The package 1000 is then flipped over to allow processing from a back side of the interposer substrate 1002.

Figure 10F:
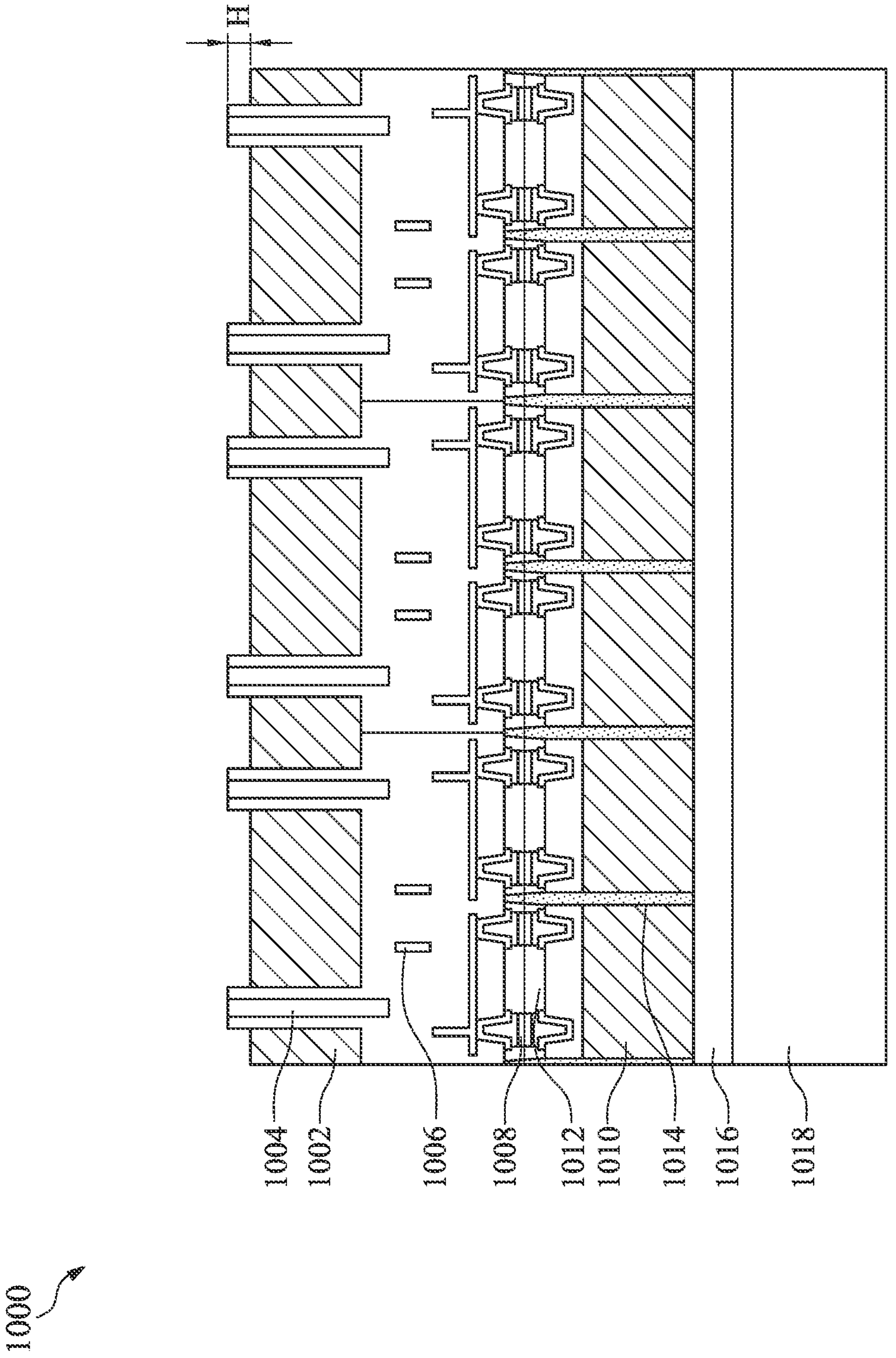

In FIG. 10F, the interposer substrate 1002 is thinned down to expose the TSVs 1004. The interposer substrate 1002 may be thinned in a grinding, lapping, etching, polishing, or combination process. In some embodiments, the interposer substrate 1002 may be recessed so that the TSVs 1004 are protruding over a top surface of the interposer substrate 1002, as shown in FIG. 10F. In some embodiments, the recess process may be performed in a multi-step process by, for example, a CMP process, a wet etch process, followed by a dry etch process. The TSVs 1004 may protrude over the interposer substrate 1002 at a height H. In some embodiments, the height His in a range between about 5 microns to about 15 microns.

Figure 10G:
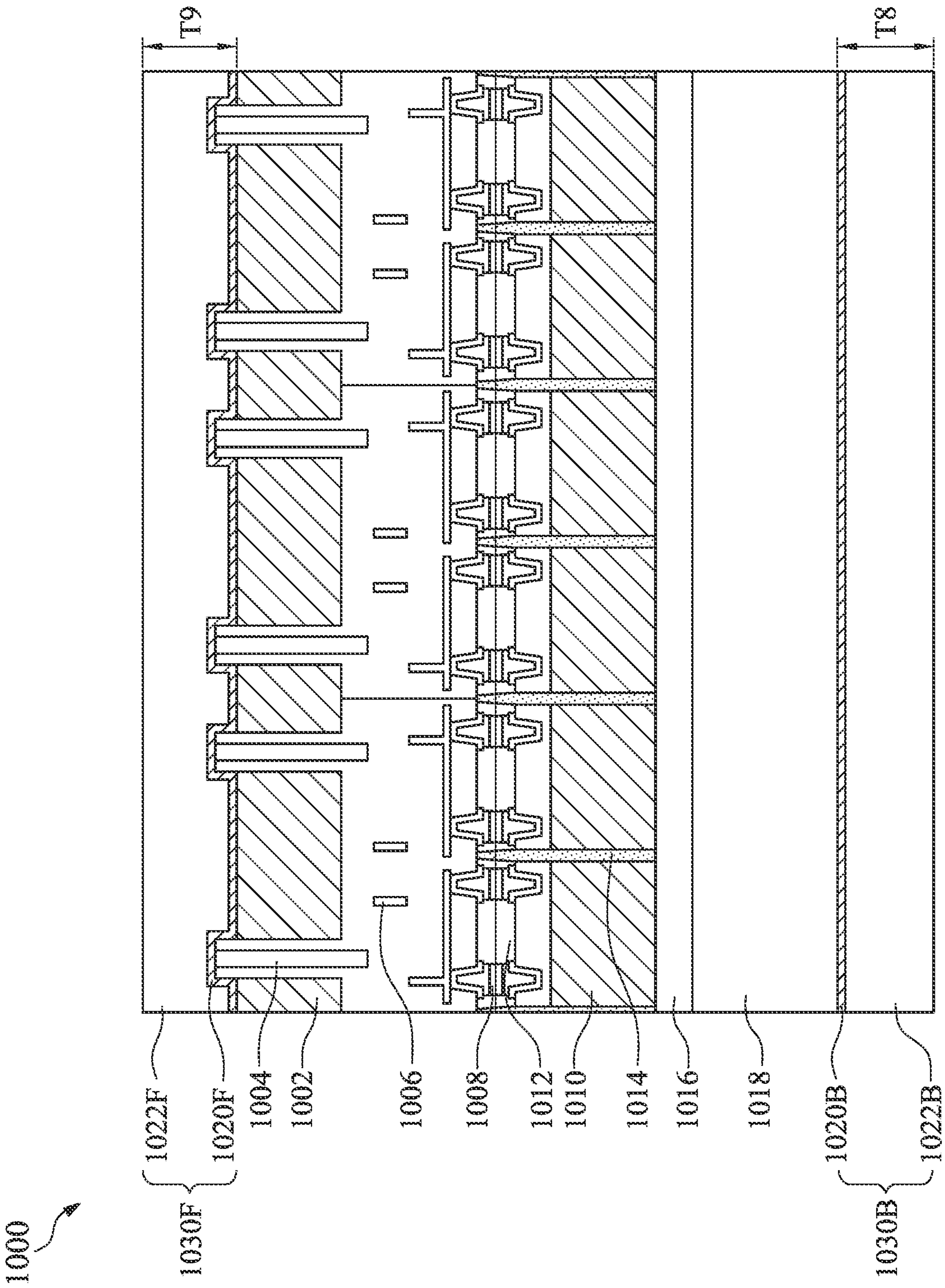

In FIG. 10G, a front side film stack 1030F is formed over the interposer substrate 1002 and the TSVs 1004, and a back side film stack 1030B is on the carrier substrate 1018. The front side film stack 1030F and the back side film stack 1030B may be formed by any of the methods 200, 400, 600 as discussed above.

The front side film stack 1030F is configured to receive connectors, such as micro bumps, connected to the TSVs 1004. The front side film stack 1030F may include dielectric materials suitable to receive the connectors. In some embodiments, the front side film stack 1030F may include an oxide layer 1020F and a passivation film 1022F over the oxide layer 1020F. In some embodiments, the oxide layer 1020F may be formed in a manner similar to the oxide film 104 according to operation 202 discussed above. The passivation film 1022F may include one or more layers of dielectric material, such as silicon nitride, silicon oxynitride, silicon oxide, or similar. In some embodiments, the front side film stack 1030F has a thickness T9 in a range between about 75 microns and 200 microns, similar to the back side film stack 112, 312, 312*a*, 512, 712, or 712*a* fabricated according to methods shown in FIG. 2, FIG. 4, FIG. 6.

The back side film stack 1030B is configured to provide stress modulation to the package 1000. For example, materials and thickness of the back side film stack 1030B are selected to modulate warpage of the package 1000 so that the package 1000 has a positive warpage. A positive warpage extends a length of the contacting surface on the front side of the packaging 1000, therefore, improves the bonding between the TSVs 1004 and connectors. The back side film stack 1030B may include dielectric materials suitable to modulate stress and warpage. In some embodiments, the back side film stack 1030B may include an oxide layer 1020B and an enhancing layer 1022B over the oxide layer 1020B. In some embodiments, the oxide layer 1020B may be formed in a manner similar to the oxide film 104 according to operation 202 discussed above. The oxide layers 1020F and the oxide layer 1020B may be formed simultaneously in a processing chamber configured to process both the front side and back side of one or more substrates. The enhancing layer 1022B may include one or more layers of dielectric material, such as silicon nitride, silicon oxynitride, silicon oxide, or similar. In some embodiments, the back side film stack 1030B has a thickness T8 in a range between about 75 microns and 200 microns, similar to the back side film stack 112, 312, 312*a*, 512, 712, or 712*a* fabricated according to methods shown in FIG. 2, FIG. 4, FIG. 5.

The front side film stack 1030F and the back side film stack 1030B may be formed by selectively performs operations described in the methods 200, 400, 600. Such as the operations 202, 204, 206, 208, 404, 406, 408, 410, 603, in suitable combinations.

In some embodiments, the front side film stack 1030F and the back side film stack 1030B may have the same composition and thicknesses, and may be formed during the same processes, by performing the operation 202 one or more times, the operations 404 and 406 one or more times, or the like, as described above.

In other embodiments, the front side film stack 1030F and the back side film stack 1030B may have different compositions and/or thickness. Various layers may be formed on both sides and then one or more films may be removed from the front side as described in operation 206, 208 or operations 408, 410.

Figure 10H:
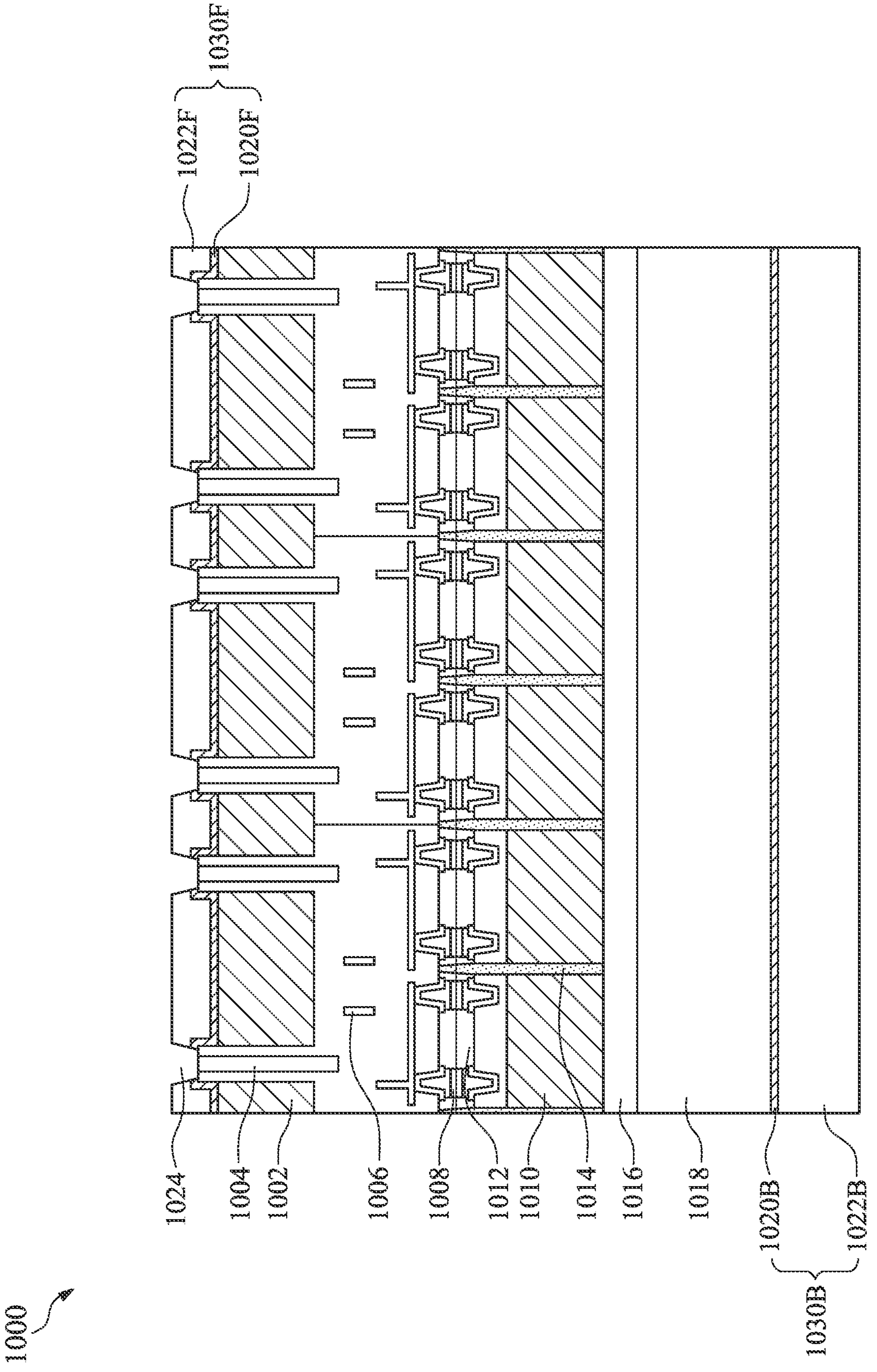

In FIG. 10H, contact openings 1024 are formed through the front side film stack 1030F to expose the TSVs 1004. In some embodiments, the contact openings 1024 are configured to receive contact pumps. As discussed above, the back side film stack 1030B may cause a positive warpage in the packaging 1000, thus expanding surface areas in the contact openings 1024 and improving bonding performance.

Figure 10I:
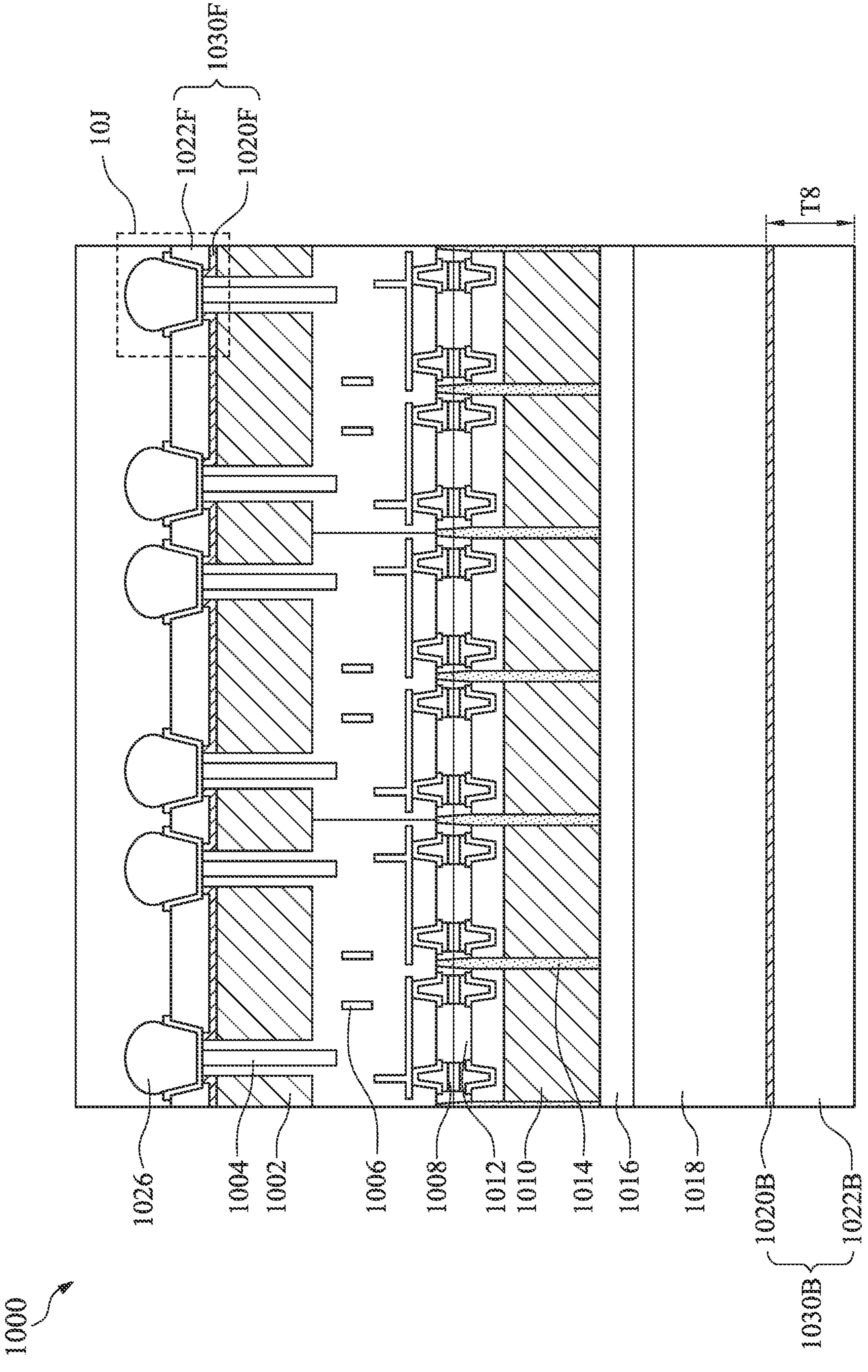

In FIG. 10I, a plurality of electrical connectors 1026 are formed the contact openings 1024 to be electrically contact the TSVs 1004. The electrical connectors 1026 may be solder balls, metal pillars, controlled collapse chip connection (C4) bumps, micro bumps, electroless nickel-electroless palladium-immersion gold technique (ENEPIG) formed bumps, or the like. The electrical connectors 1026 may be formed by commonly used methods such as evaporation, electroplating, printing, solder transfer, ball placement, or the like.

Figure 10J:
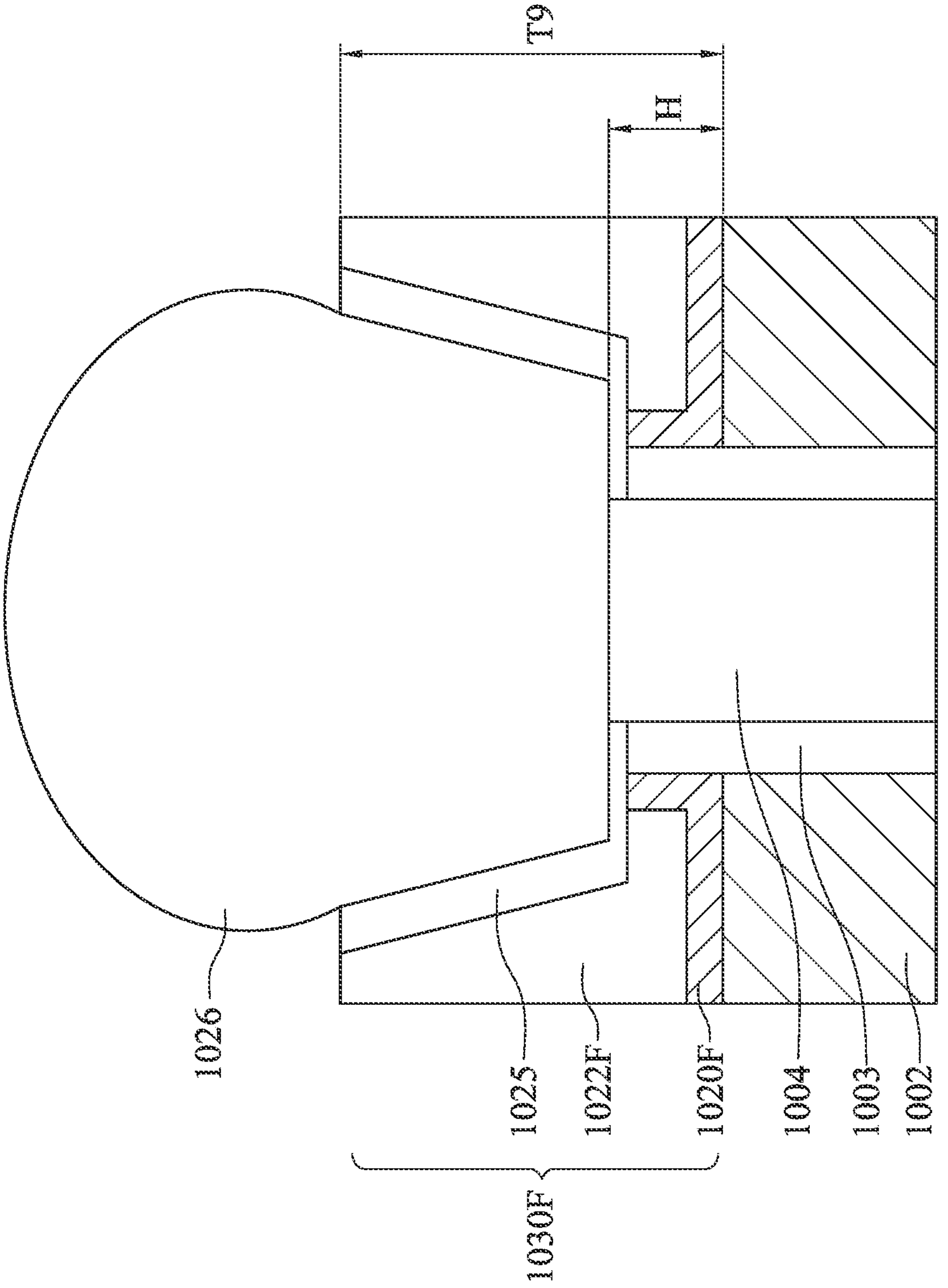

FIG. 10J is a schematically enlarged view of an area 10J in FIG. 10I showing details around the electrical connectors 1026 and the TSVs 1004. As shown in FIG. 10J, a liner layer 1003 may be formed around the TSV 1004 between the TSV 1004 and the interposer substrate 1002. The liner layer 1003 and the TSV 1004 protrude over the interposer substrate 1002 for about the height H. The electrical connector 1026 is disposed in the front side film stack 1030F. A liner layer 1025 may be disposed between the electrical connector 1026 and the front side film stack 1030F. The front side film stack 1030F may have a thickness T9. The front side film stack 1030F includes one or more dielectric materials. Exemplary composition of the front side film stack 1030F may be similar to, but not limited by, the back side film stacks 112, 312, 312*a*, 512, 712, 712*a*.

Figure 10K:
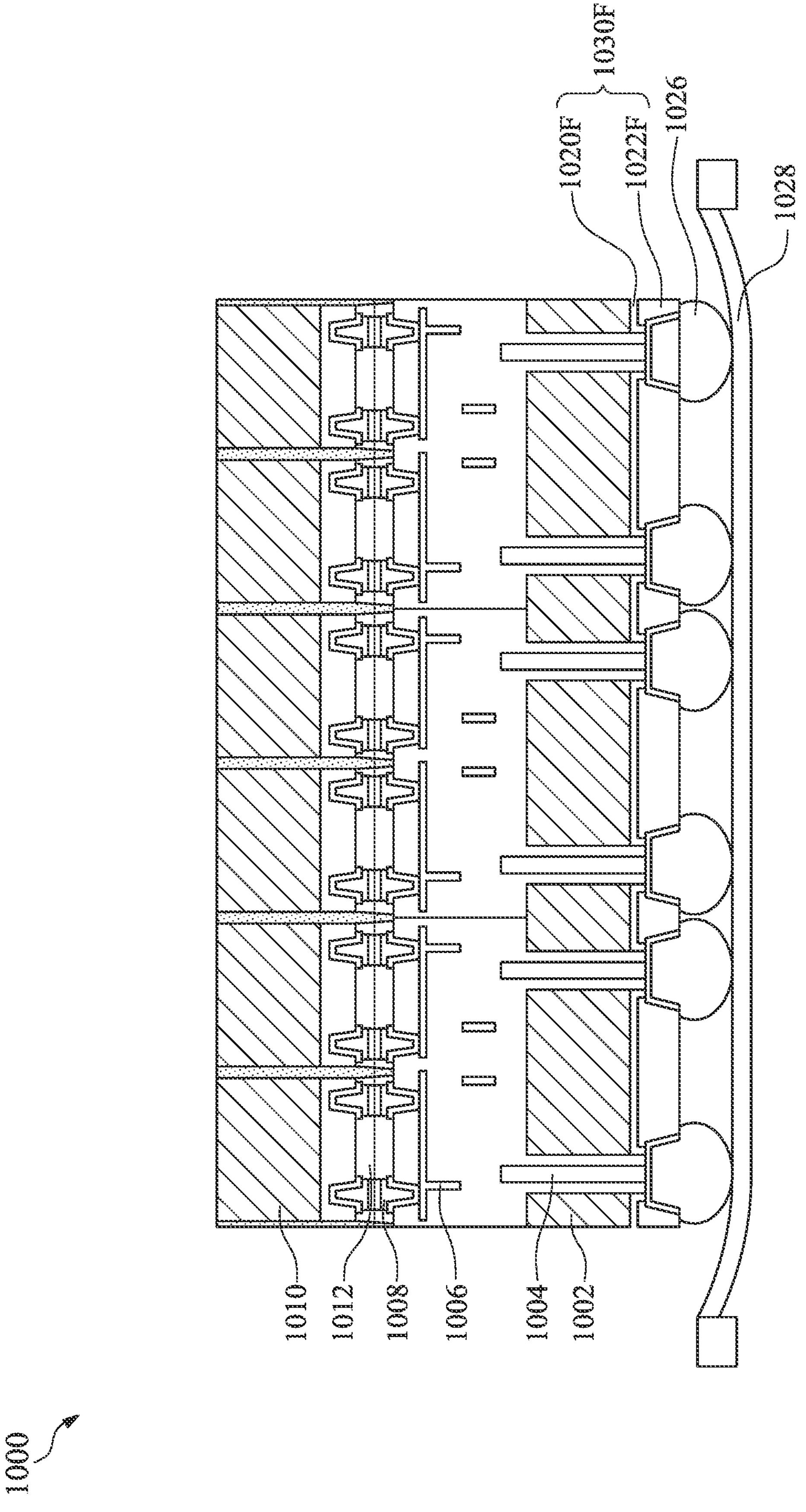

In FIG. 10K, the back side film stack 1030B is removed along with the carrier substrate 1018. The package 1000 may be attached to additional package, such as a printed circuit board 1028, via the electrical connectors 1026.

Figure 11:
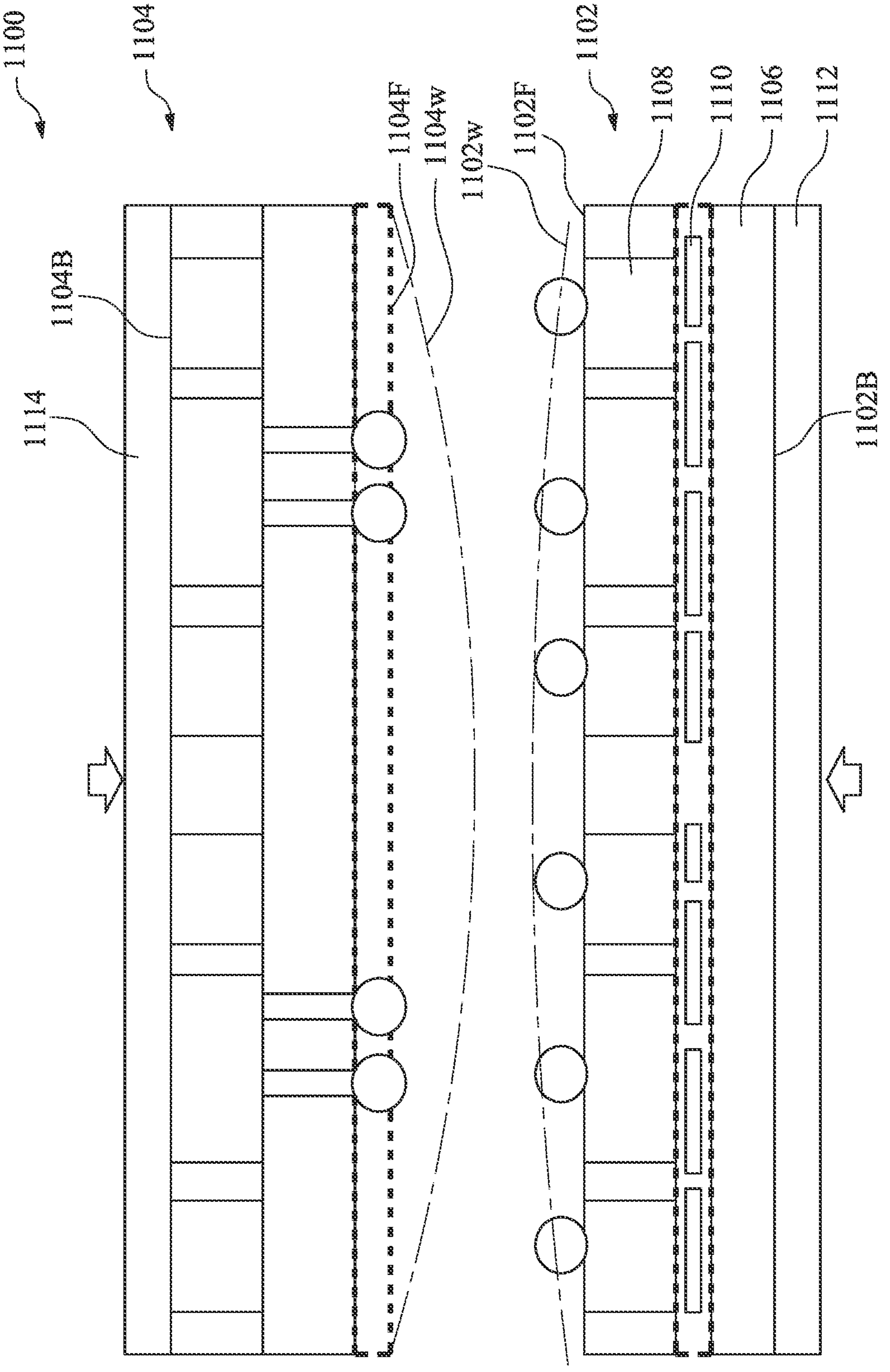
FIG. 11 schematically demonstrates warpage modulation according to the present disclosure in a System on Integrated Chips (SoIC) packaging scheme.

The film stacks according to the present disclosure may be used in any suitable packaging schemes where warpage modulation is desired. FIG. 11 schematically demonstrates warpage modulation according to the present disclosure in a System on Integrated Chips (SoIC) package 1100. The package 1100 may include a first substrate 1102 and a second substrate 1104 to be bonded together. At bonding, a front surface 1102F of the first substrate 1102 and a front surface 1104F of the second substrate 1104 are pressured against each other.

The first substrate 1102 may include a carrier substrate 1106 attached an interconnect structure 1110 and one or more integrated chip dies 1108. In some embodiments, a back side film stack 1112 is formed on a back side 1102B of the first substrate 1102. The back side film stack 1112 may be formed according to the present disclosure, and functions to generate a positive warpage in the first substrate 1102. The back side film stack 1112 includes one or more dielectric materials. Exemplary composition of the back side film stack 1112 may be similar to, but not limited by, the back side film stacks 112, 312, 312*a*, 512, 712, 712*a*. Curve 1102W schematically demonstrates a warpage profile of the first substrate 1102 after warpage modulation by the back side film stack 1112. The positive warpage in the first substrate 1102 improves bonding performance between the first substrate 1102 and the second substrate 1104.

Optionally, a film stack 1114 may be formed on a back side 1104B of the second substrate 1104. The film stack 1114 may be formed according to the present disclosure, and functions to generate a positive warpage in the second substrate 1104. The film stack 1114 includes one or more dielectric materials. Exemplary composition of the film stack 1114 may be similar to, but not limited by, the back side film stacks 112, 312, 312*a*, 512, 712, 712*a*. Curve 1104W schematically demonstrates a warpage profile of the second substrate 1104 after warpage modulation by the film stack 1114. The positive warpage in the second substrate 1104 improves bonding performance between the first substrate 1102 and the second substrate 1104. In some embodiments, the film stack 1114 creates a compressive warpage which improves adhesion on the electrical connectors 1026, or solder balls.

Various embodiments or examples described herein offer multiple advantages over the state-of-art technology. The film stack according to present disclosure may reduce wet dip attacking to semiconductor substrate during bonding, such as bonding between an image sensor substrate and a logic device substrate. The film stack according to the present disclosure may be used to modulate stress and wafer warpage to improve bonding adhesion and device performance during various packaging schemes, such as CoWoS, SoIC, or the like. The film stack according to the present disclosure may be used to improve bonding process and device performance in both wafer-to-wafer bonding and die-to-die bonding. The novel multi-layer film backside structure and process method according to the present disclosure can prevent contaminant on CIS/ISP for wafer to wafer or die to die bonding. The multi-layer film structure may provide warpage/stress modulation during processing and bonding. For example, the novel multi-layers film structure can modulate stress and wafer warpage during in CoWoS and SOIC packaging scheme, therefore, improving bonding adhesion and device performance. It will be understood that not all advantages have been necessarily discussed herein, no particular advantage is required for all embodiments or examples, and other embodiments or examples may offer different advantages.

Some embodiments of the present provide a method comprising: forming a front side oxide layer and a back side oxide layer on a first substrate; depositing a front side nitride layer on the front side oxide layer and a back side nitride layer on the back side nitride layer; forming an enhancing layer on the back side nitride layer; and performing a process sequence to fabricate a circuitry structure on the front side nitride layer.

Some embodiments of the present disclosure provide a method for modulating warpage, comprising providing a first substrate, wherein the first substrate has a front surface and a back surface; depositing a back side film stack on the back surface to create a positive warpage profile in the first substrate; and bonding the front surface of the first substrate to a second substrate or electrical connectors.

Some embodiments of the present disclosure provide a package structure comprising: a substrate having a through substrate vias (TSV) formed therein, wherein the TSV protrudes over a first side of the substrate; one or more integrated chips bonded on a second side of the substrate; a film stack formed on the first side of the substrate, wherein the film stack comprises a first oxide layer formed on the substrate and the TSV; a first nitride layer formed on the first oxide layer; and an enhancing layer formed on the first nitride layer; and electrically connectors disposed in the film stack and in contact with the TSV.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:

forming a front side oxide layer and a back side oxide layer on a first substrate;

depositing a front side nitride layer on the front side oxide layer and a back side nitride layer on the back side nitride layer;

forming an enhancing layer on the back side nitride layer;

performing a process sequence to fabricate a circuitry structure on the front side nitride layer; and bonding a second substrate to the circuitry structure, wherein the enhancing layer is exposed during bonding process.

2. The method of claim 1, wherein the second substrate includes image sensors formed thereon, and the circuitry structure is configured to control the image sensors in the second substrate.

3. The method of claim 2, wherein performing the process sequence comprises:

growing a polycrystalline silicon layer on the enhancing layer; and removing the polycrystalline silicon layer.

4. The method of claim 1, wherein forming the enhancing layer comprises:

depositing an etch stop layer on the front side nitride layer;

depositing the enhancing layer on the back side nitride layer and the etch stop layer;

removing the enhancing layer from the etch stop layer; and removing the etch stop layer to expose the front side nitride layer.

5. The method of claim 4, further comprising:

implanting the back side nitride layer prior to depositing the etch stop layer.

6. The method of claim 1, wherein forming the enhancing layer comprises:

depositing a first front side etch stop layer on the front side nitride layer and a first back side etch stop layer on the back side nitride layer;

depositing a first dielectric layer on the first back side etch stop layer and the first front side etch stop layer;

removing the first dielectric layer from the first front side etch stop layer; and removing the first front side etch stop layer to expose the front side nitride layer.

7. The method of claim 6, further comprising depositing a second front side etch stop layer on the front side nitride layer and a second back side etch stop layer on the first dielectric layer;

depositing a second dielectric layer on the first dielectric layer and the second front side etch stop layer;

removing the second dielectric layer from the second front side etch stop layer; and removing the second front side etch stop layer to expose the front side nitride layer.

8. The method of claim 6, further comprising:

implanting the back side nitride layer prior to forming the first back side etch stop layer.

9. A method for modulating warpage, comprising:

providing a first substrate, wherein the first substrate has a front surface and a back surface;

depositing a back side film stack on the back surface to create a positive warpage profile in the first substrate, wherein depositing the back side film side comprises:

depositing a first front side etch stop layer over the front surface of the first substrate and a first back side etch stop layer over the back surface of the first substrate;

depositing a first enhancing layer on the first back side etch stop layer and the first front side etch stop layer:

removing the first enhancing layer from the first front side etch stop layer; and removing the first front side etch stop layer; and bonding the front surface of the first substrate to a second substrate or electrical connectors.

10. The method of claim 9, wherein depositing the back side film stack comprises:

forming a front side oxide layer and a back side oxide layer on the first substrate;

depositing a front side nitride layer on the front side oxide layer and a back side nitride layer on the back side nitride layer, wherein the first front side etch stop layer is deposited on the front side nitride layer and the first back side etch stop layer is deposited on the back side nitride layer.

11. The method of claim 10, further comprising:

forming a plurality of contact openings through the front side enhancing layer, the front side nitride layer and the front side oxide layer; and forming a plurality of electrical connectors in the plurality of contact openings.

12. The method of claim 11, wherein providing the first substrate comprises:

providing an interposer substrate having a plurality of through substrate vias (TSVs) formed therein and an interconnect structure formed on a first side of the interposer substrate;

bonding one or more integrated chips on the interconnect structure;

attaching a carrier substrate to the one or more integrated chips; and thinning a second side of the interposer substrate to expose the TSVs.

13. The method of claim 12, wherein the back side film stack is formed on the carrier substrate, and the front side oxide layer and the front side nitride layer are formed on the second side of the interposer substrate and exposed portions of the TSVs.

14. The method of claim 9, wherein providing the first substrate comprises:

providing a carrier substrate; and bonding one or more integrated circuit dies on a first side of the carrier substrate, wherein the back side film stack is formed on a second side of the carrier substrate.

15. A method, comprising:

forming a front side oxide layer and a back side oxide layer on a first substrate;

depositing a front side nitride layer on the front side oxide layer and a back side nitride layer on the back side nitride layer;

forming an enhancing layer on the back side nitride layer; and performing a process sequence to fabricate a circuitry structure on the front side nitride layer, wherein forming the enhancing layer comprises:

depositing a first front side etch stop layer on the front side nitride layer and a first back side etch stop layer on the back side nitride layer;

depositing a first dielectric layer on the first back side etch stop layer and the first front side etch stop layer;

removing the first dielectric layer from the first front side etch stop layer; and removing the first front side etch stop layer to expose the front side nitride layer.

16. The method of claim 15, further comprising depositing a second front side etch stop layer on the front side nitride layer and a second back side etch stop layer on the first dielectric layer;

depositing a second dielectric layer on the first dielectric layer and the second front side etch stop layer;

removing the second dielectric layer from the second front side etch stop layer; and removing the second front side etch stop layer to expose the front side nitride layer.

17. The method of claim 15, further comprising:

implanting the back side nitride layer prior to forming the first back side etch stop layer.

18. The method of claim 15, wherein performing the process sequence comprises:

growing a polycrystalline silicon layer on the enhancing layer; and removing the polycrystalline silicon layer.

19. The method of claim 15, wherein the first dielectric layer comprises a nitride of a semiconductor material.

20. The method of claim 16, wherein the first dielectric layer has a first thickness, the second dielectric layer has a second thickness, and the second thickness is greater than the first thickness.

* * * * *